(12) United States Patent
Kantarovsky et al.

(10) Patent No.: US 12,119,383 B2
(45) Date of Patent: Oct. 15, 2024

(54) TRANSISTOR WITH MULTI-LEVEL SELF-ALIGNED GATE AND SOURCE/DRAIN TERMINALS AND METHODS

(71) Applicant: GlobalFoundries U.S. Inc., Malta, NY (US)

(72) Inventors: Johnatan A. Kantarovsky, South Burlington, VT (US); Mark D. Levy, Williston, VT (US); Jeonghyun Hwang, Ithaca, NY (US); Siva P. Adusumilli, South Burlington, VT (US); Ajay Raman, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/174,052

(22) Filed: Feb. 24, 2023

(65) Prior Publication Data
US 2023/0207639 A1  Jun. 29, 2023

Related U.S. Application Data

(62) Division of application No. 17/146,513, filed on Jan. 12, 2021, now Pat. No. 11,646,351.

(51) Int. Cl.
*H01L 29/40* (2006.01)
*H01L 21/768* (2006.01)
(Continued)

(52) U.S. Cl.
CPC ...... *H01L 29/401* (2013.01); *H01L 21/76897* (2013.01); *H01L 29/41766* (2013.01);
(Continued)

(58) Field of Classification Search
None
See application file for complete search history.

(56) References Cited

U.S. PATENT DOCUMENTS 7,470,941 B2  12/2008  Micovic et al.
7,932,539 B2  4/2011  Chen et al.
(Continued)

FOREIGN PATENT DOCUMENTS

CN  108735601 A  * 11/2018  ......... H01L 29/0665

OTHER PUBLICATIONS

English Translation of Fang et al. (Year: 2018).*
(Continued)

*Primary Examiner* — Khaja Ahmad
(74) *Attorney, Agent, or Firm* — Francois Pagette; Hoffman Warnick LLC

(57) ABSTRACT

Disclosed are a transistor and a method for forming the transistor. The method includes concurrently forming gate and source/drain openings through an uppermost layer (i.e., a dielectric layer) in a stack of layers. The method can further include: depositing and patterning gate conductor material so that a first gate section is in the gate opening and a second gate section is above the gate opening and so that the source/drain openings are exposed; extending the depth of the source/drain openings; and depositing and patterning source/drain conductor material so that a first source/drain section is in each source/drain opening and a second source/drain section is above each source/drain opening. Alternatively, the method can include: forming a plug in the gate opening and sidewall spacers in the source/drain openings; extending the depth of source/drain openings; depositing and patterning the source/drain conductor material; and subsequently depositing and patterning the gate conductor material.

15 Claims, 22 Drawing Sheets

(51) Int. Cl.
- H01L 29/417 (2006.01)
- H01L 29/423 (2006.01)
- H01L 29/45 (2006.01)
- H01L 29/47 (2006.01)
- H01L 29/49 (2006.01)
- H01L 29/66 (2006.01)
- H01L 29/778 (2006.01)

(52) U.S. Cl.
CPC .. *H01L 29/42316* (2013.01); *H01L 29/42376* (2013.01); *H01L 29/66462* (2013.01); *H01L 29/7786* (2013.01); *H01L 29/452* (2013.01); *H01L 29/475* (2013.01); *H01L 29/49* (2013.01); *H01L 29/4983* (2013.01)

(56) References Cited

U.S. PATENT DOCUMENTS

| | | | |
|---|---|---|---|
| 8,324,037 B1 | 12/2012 | Shih et al. | |
| 10,679,860 B2 | 6/2020 | Bera et al. | |
| 2010/0330754 A1 | 12/2010 | Hebert | |
| 2011/0193096 A1 | 8/2011 | Imada | |
| 2011/0272743 A1* | 11/2011 | Hwang | H01L 29/66462 257/E21.403 |
| 2013/0056796 A1 | 3/2013 | Khan et al. | |
| 2013/0193485 A1* | 8/2013 | Akiyama | H01L 29/66462 257/194 |
| 2013/0295757 A1 | 11/2013 | Xu et al. | |
| 2014/0091365 A1 | 4/2014 | Kikkawa et al. | |
| 2014/0264454 A1* | 9/2014 | Banerjee | H01L 29/66462 257/194 |
| 2014/0335666 A1 | 11/2014 | Koehler et al. | |
| 2015/0270371 A1* | 9/2015 | Hsiung | H01L 29/517 438/172 |
| 2016/0336314 A1* | 11/2016 | Chou | H01L 29/517 |
| 2018/0033631 A1 | 2/2018 | Bera et al. | |
| 2020/0227544 A1* | 7/2020 | Then | H01L 29/7786 |
| 2022/0085163 A1 | 3/2022 | Lin et al. | |
| 2022/0102541 A1* | 3/2022 | Lin | H01L 29/404 |

OTHER PUBLICATIONS

Anonymous, "IMEC Shows Scalable III-V and III-N Devices on Silicon," 2020, retrieved from: https://compoundsemiconductor.net/article/109922/Imec_shows_scalable_III-V_and_III-N_Devices_on_Silicon, on Oct. 13, 2020, 2 pages.

Kawango et al., "Advantage of TiN Schottky Gate over Conventional Ni for Improved Electrical Characteristics in AlGaN/GaN Hemt," IEEE Proceedings of the European Solid-State Device Research Conference (ESSDERC), 2013, 4 pages.

Mishra et al., "Novel High Performance Self-Aligned 0.15 Micron Long T-Gate AlInAs-GaInAs HEMTs, " IEEE, 1989, 4 pages.

Waldron et al., "A Self-Aligned InGaAs HEMT Architecture for Logic Applications," IEEE Transactions on Electron Devices, vol. 57, No. 1, Jan. 2010, pp. 297-304.

Xia et al., "Effects of the cap layer on the properties of AlN barrier HEMT grown on 6-inch Si(111) substrate, " Materials Research Express 7 065902, 2020, 7 pages.

U.S. Appl. No. 17/146,513, Office Action dated Aug. 15, 2022, 14 pages.

U.S. Appl. No. 17/146,513, Final Office Action dated Nov. 17, 2022, 11 pages.

U.S. Appl. No. 17/146,513, Notice of Allowance dated Feb. 1, 2023, 10 pages.

* cited by examiner

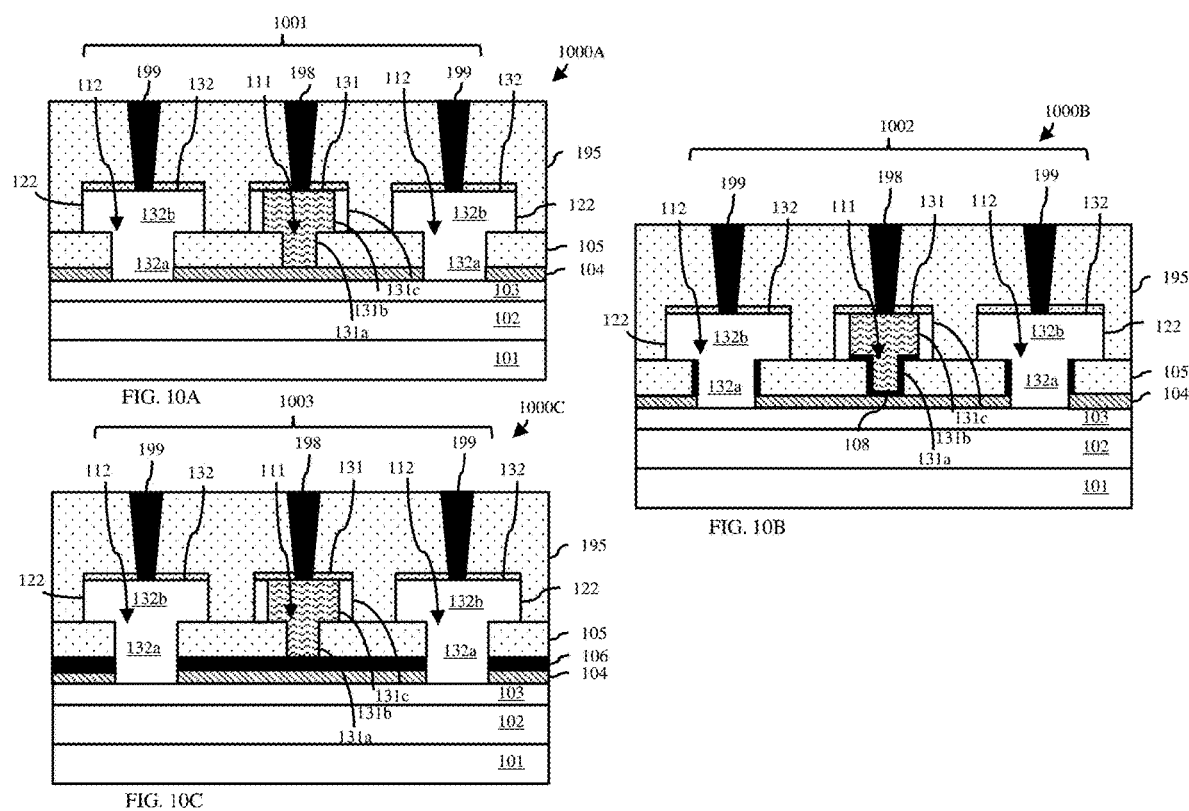

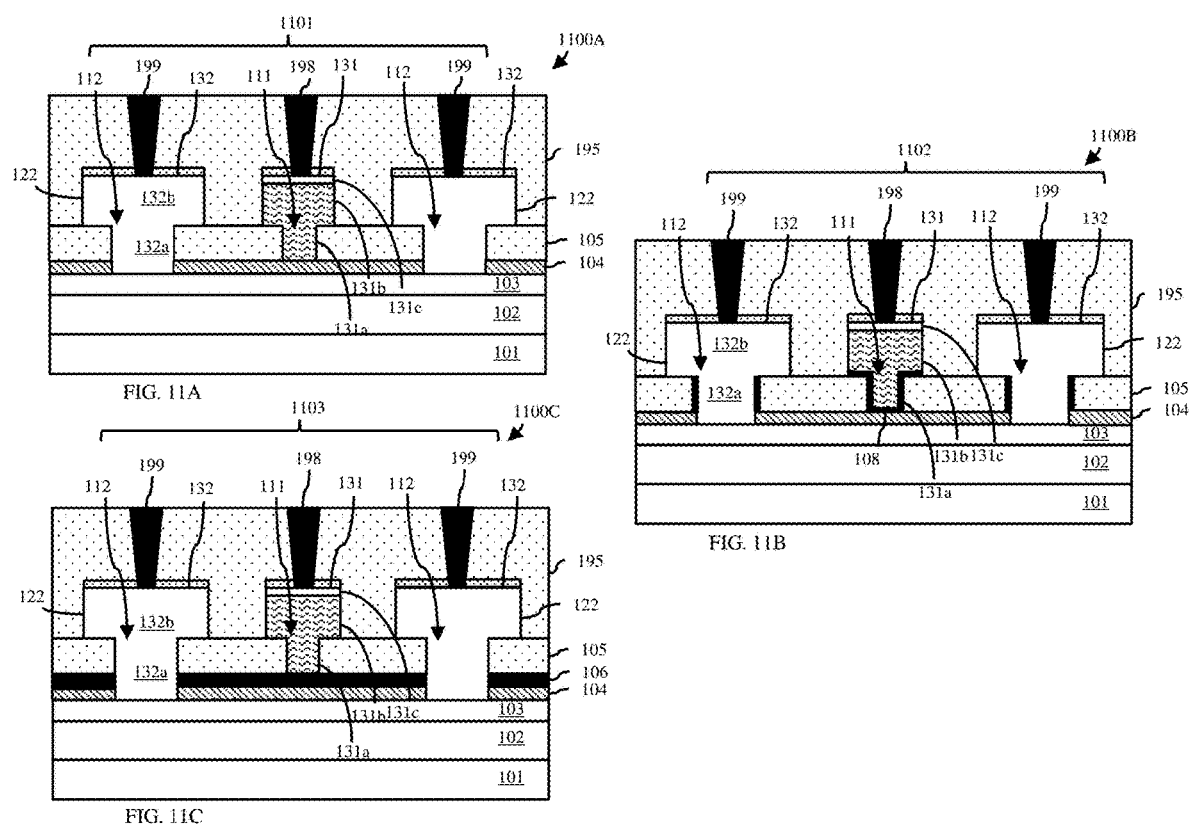

TRANSISTOR WITH MULTI-LEVEL SELF-ALIGNED GATE AND SOURCE/DRAIN TERMINALS AND METHODS

BACKGROUND

Field of the Invention

The present invention relates to transistors, such as III-V high electron mobility transistors (HEMTs), III-V metal-insulator-semiconductor HEMTs (MISHEMTs) or other types of transistors. More particularly, the present invention relates to embodiments of a method of forming a transistor so that terminal misalignment is avoided and a structure formed according to the method.

Description of Related Art

III-V semiconductor devices, such as high electron mobility transistors (HEMTs) and metal-insulator-semiconductor HEMTs (MISHEMTs), have emerged as a leading technology for radio frequency (RF) and millimeter wave (mm-Wave) (e.g., 3-300 GHz) wireless applications. However, as device sizes continue to be reduced to enable better performance, HEMTs and MISHEMTs as well as other types of transistors can suffer from fails due to misalignment of the terminals and, particularly, misalignment of the gate and source/drains terminals during manufacturing.

SUMMARY

Disclosed herein are embodiments of a semiconductor structure. The semiconductor structure can include a stack of layers on a substrate. The stack of layers can include at least the following layers: a channel layer; a barrier layer on the channel layer; and a dielectric layer on the barrier layer. The semiconductor structure can further include a transistor. This transistor can include source/drain terminals and a gate terminal positioned laterally between the source/drain terminals. Specifically, each source/drain terminal can include a first source/drain section and a second source/drain section. The first source/drain section can be within a source/drain opening, which extends through the dielectric layer and the barrier layer to the channel layer. The second source/drain section can be above the source/drain opening and, more particularly, above and immediately adjacent to the first source/drain section so to be above the level of the top surface of the dielectric layer. Optionally, the second source/drain section can be wider than the first source/drain section such that it extends laterally onto the top surface of the dielectric layer. The gate terminal can include a first gate section and a second gate section. The first gate section can be within a gate opening, which extends through the dielectric layer and which has a bottom above the barrier layer in the stack (e.g., immediately adjacent to the top surface of the barrier layer or, in some embodiments, physically separated from the top surface of the barrier layer by a gate dielectric). The second gate section can be above the gate opening and, more particularly, above and immediately adjacent to the first gate section so as to be above the level of the top surface of the dielectric layer. Optionally, the second gate section can be wider than the first gate section such that it extends laterally onto the top surface of the dielectric layer. In any case, the first source/drain section and the second source/drain section be made, at least primarily, of source/drain conductor material, whereas, the first gate section and the second gate section can be made, at least primarily, of a gate conductor material that is different from the source/drain conductor material.

Also disclosed herein are method embodiments for forming the above-described semiconductor structure.

Generally, the method embodiments can include forming a stack of layers on a substrate. This stack of layers can include at least: a channel layer; a barrier layer on the channel layer; and a dielectric layer on the barrier layer. The method can further include forming a transistor, as described above, in the stack.

In each of the embodiments of the method, the transistor can be formed by first concurrently forming multiple openings through the dielectric layer. These openings can be formed, for example, using conventional lithographic patterning and etch processes and can include source/drain openings and a gate opening, which is positioned laterally between the source/drain openings. Optionally, the openings can be patterned so that the gate opening is narrower than the source/drain openings.

In some embodiments, additional processing to form the transistor can include depositing a layer of a gate conductor material over the dielectric layer and into the multiple openings. The layer of the gate conductor material can then be patterned to form, for a gate terminal, a first gate section within the gate opening and a second gate section, which is above the gate opening and, more particularly, which is above and immediately adjacent to the first gate section such that it is above the level of the top surface of the dielectric layer. Optionally, the gate conductor material can be patterned so that the second gate section is wider than the first gate section and, thus, so that the second gate section extends laterally onto the top surface of the dielectric layer. In any case, patterning of the layer of the gate conductor material can be performed so that the source/drain openings are also exposed. The source/drain openings can then be extended deeper into the stack and, specifically, down to the channel layer. A layer of a source/drain conductor material, which is different from the gate conductor material, can subsequently be deposited over the partially completed structure. The layer of source/drain conductor material can be patterned in order to form, for each of two source/drain terminals, a first source/drain section within a. source/drain opening and a second source/drain section above the source/drain opening and, more particularly, above and immediately adjacent to the first source/drain section so as to be above the level of the top surface of the dielectric layer. Optionally, the source/drain conductor material can be patterned so that the second source/drain section of each source/drain terminal is wider than the first source/drain section and, thus, so that the second source/drain sections extend laterally onto the top surface of the dielectric layer. It should be noted that this source/drain conductor material patterning process also concurrently makes final adjustments to the shape of the second gate section.

In other embodiments, additional processing to form the transistor can include forming a protective plug in the gate opening and sidewall spacers in the source/drain openings. As discussed further in the detailed description section, formation of the protective plug in the gate opening and the sidewall spacers in the source/drain openings can be concurrent and achieved using a conventional sidewall spacer formation technique when the gate opening is narrower than the source/drain openings. The source/drain openings can then be extended deeper into the stack and, specifically, down to the channel layer. Optionally, the protective plug and sidewall spacers can be selectively removed at this point in the method. A layer of a source/drain conductor material can then be deposited. The layer of source/drain conductor material can be patterned to form, for each of two source/drain terminals, a first source/drain section within a source/drain opening and a second source/drain section above the source/drain opening and, more particularly, above and immediately adjacent to the first source/drain section so as to be above the level of the top surface of the dielectric layer. Optionally, the source/drain conductor material can be patterned so that each second source/drain section is wider than the first source/drain section below and, thus, so that the second source/drain sections extend laterally onto the top surface of the dielectric layer. It should be noted that the patterning of the layer of source/drain conductive material can be performed so as to also expose the gate opening. That is, any source/drain conductive material and, if applicable, the protective plug can be removed from the gate opening during this patterning process. Then, a layer of a gate conductor material, which is different from the source/drain conductor material, can be deposited over the partially completed structure. This layer of the gate conductor material can be patterned to form, for a gate terminal, a first gate section within the gate opening and the second gate section above the gate opening and, more particularly, above and immediately adjacent to the first gate section so as to be above the level of the top surface of the dielectric layer. Optionally, the gate conductor material can be patterned so that the second gate section is wider than the first gate section and, thus, so that the second gate section extends laterally onto the top surface of the dielectric layer. It should be noted that this gate conductor material patterning process also concurrently makes final adjustments to the shape of the first gate section.

Since in all of the method embodiments, the dielectric layer is concurrently patterned with the gate opening for the first gate section for the gate terminal and with the source/drain openings for the first source/drain sections of the source/drain terminals, those lower-level first gate and source/drain sections within the dielectric layer are considered self-aligned. Furthermore, since in all of the method embodiments, the last conductor material patterning process, impacts the final shapes of all upper-level sections of the gate and source/drain terminals (i.e., the second gate section and the second source/drain sections), those upper-level sections are also considered self-aligned. With these multi-level self-aligned gate and source/drain terminals, fails related to terminal misalignment are avoided (e.g., as device sizes are reduced).

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 10A-10C are cross-section diagrams illustrating alternative embodiments of a HEMT, a MISHEMT and another MISHEMT, respectively, formed according to process flow A;

FIGS. 11A-11C are cross-section diagrams illustrating alternative embodiments of a HEMT, a MISHEMT and another MISHEMT, respectively, formed according to process flow A;

DETAILED DESCRIPTION

Figure 1A:
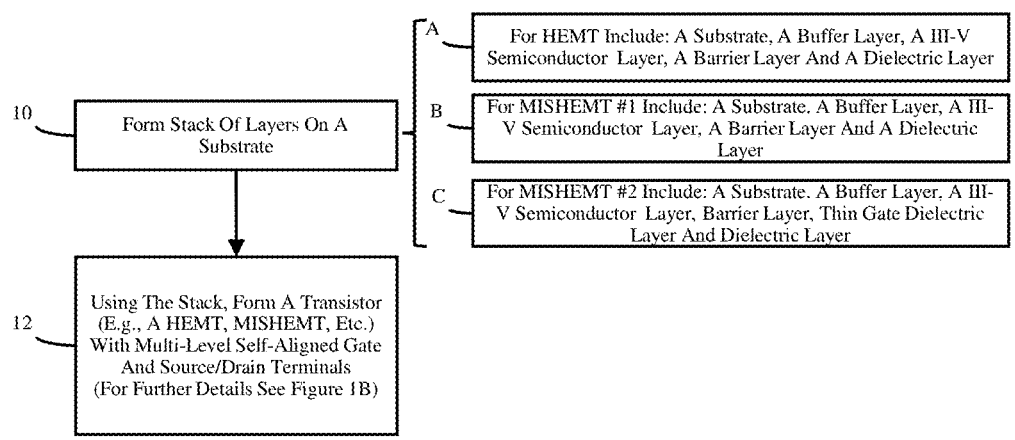
FIG. 1A is a flow diagram illustrating method embodiments for forming a semiconductor structure.

As mentioned above, III-V semiconductor devices, such as high electron mobility transistors (HEMTs) and metal-insulator-semiconductor HEMTs (MISHEMTs), have emerged as a leading technology for radio frequency (RF) and millimeter wave (mmWave) (e.g., 3-300 GHz) wireless applications. However, as device sizes continue to be reduced to enable better performance, HEMTs and MISHEMTs as well as other types of transistors can suffer from fails due to misalignment of the terminals and, particularly, misalignment of the gate and source/drains terminals during manufacturing.

In view of the foregoing, disclosed herein are embodiments of a semiconductor structure that includes a transistor (e.g., a high electron mobility transistor (HEMT), a metal-insulator-semiconductor HEMT (MISHEMT), etc.) with multi-level self-aligned gate and source/drain terminals so that fails related to terminal misalignment are avoided (e.g., as device sizes are reduced). Also disclosed herein are various method embodiments for forming such a semiconductor structure. Specifically, the method embodiments can include concurrently forming (e.g., lithographically patterning and etching) a gate opening and source/drain openings through an uppermost layer of a stack of layers and, particularly, through a dielectric layer. In some embodiments, the method can further include: depositing and patterning gate conductor material so that the gate terminal includes a first gate section in the gate opening and a second gate section above the gate opening and so that the source/drain openings are exposed; extending the source/drain openings deeper within the stack; and depositing and patterning source/drain conductor material so that each source/drain terminal includes a first source/drain section within a source/drain opening and a second source/drain section above the source/drain opening. This last conductor material patterning process also concurrently makes final adjustments to the shape of the second gate section. In other embodiments, the source/drain openings can extend any conductor material deposition and the order of gate conductor material and source/drain conductor material deposition and patterning can be switched. For example, in other embodiments method can further include: concurrently forming a plug in the gate opening and sidewall spacers in the source/drain openings; extending the source/drain openings deeper in the stack; depositing and patterning source/drain conductor material so that each source/drain terminal includes a first source/drain section in a source/drain opening and a second source/drain section above the source/drain opening and so that the gate opening is exposed; and depositing and patterning gate conductor material for the gate terminal so that the gate terminal includes a first gate section in the gate opening and a second gate section above the gate opening. This last conductor material patterning process also concurrently makes final adjustments to the shapes of the second source/drain sections. Since in all of the method embodiments, the dielectric layer is concurrently patterned with the gate opening for the first gate section of the gate terminal and with the source/drain openings for the first source/drain sections of the source/drain terminals, those lower-level sections within the dielectric layer are considered self-aligned. Furthermore, since in all of the method embodiments, the last conductor material patterning process impacts the final shapes of the second gate section of the gate terminal and the second source/drain sections of the source/drain terminals, those upper-level sections of the gate and source/drain terminals, which are above the dielectric layer, are also considered self-aligned.

Figure 1B:
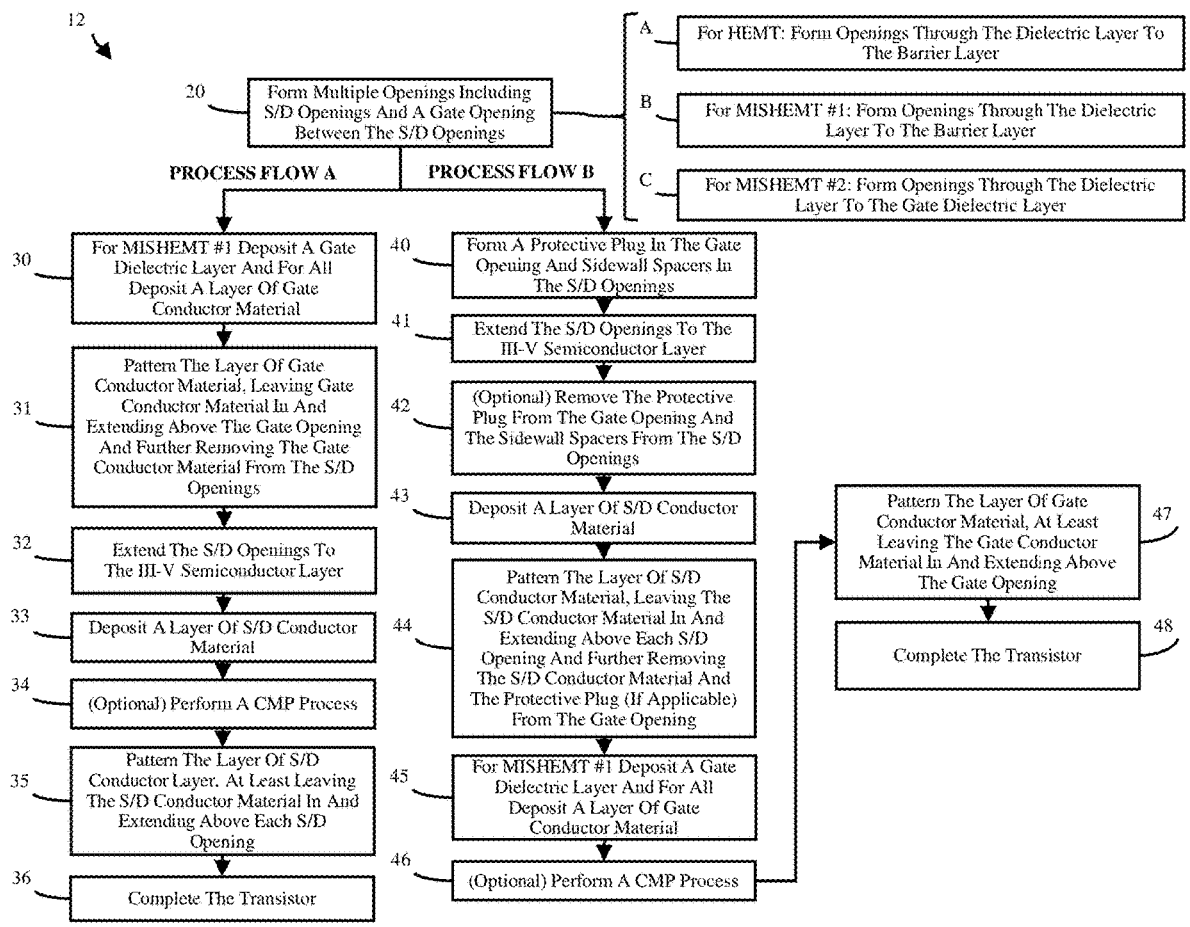
FIG. 1B is a flow diagram further illustrating exemplary process flows A and B, which can be employed at process step 12 of FIG. 1A.

FIG. 1A is a flow diagram illustrating method embodiments for forming a semiconductor structure. Generally, the method embodiments can include forming a stack of layers required for transistor formation (e.g., required for high electron mobility transistor (HEMT) formation, required for metal-insulator-semiconductor HEMT (MISHEMT) formation, or required for formation of some other similar type of transistor) (see process step 10). The method embodiments can further include using the stack to form a transistor (e.g., a HEMT, MISHEMT, etc.) with multi-level self-aligned gate and source/drain terminals so that fails related to terminal misalignment are avoided (e.g., as device sizes are reduced). FIG. 1B is a flow diagram further illustrating exemplary process flows A and B, which can be employed at process step 12 to form the transistor.

It should be noted that the method embodiments are described below and illustrated in the figures with respect to formation of a HEMT that does not require a gate dielectric layer, formation of a MISHEMT including a conformal gate dielectric layer, and formation of a MISHEMT with a built-in gate dielectric layer in the stack of layers. Thus, in the figures, each "A" figure represents a partially completed or completed HEMT structure, each "B" figure represents a partially completed or completed MISHEMT structure with a conformally deposited gate dielectric layer, and each "C" figure represents a partially completed or completed MISHEMT structure with built-in gate dielectric layer in the stack of layers.

Figure 2A:
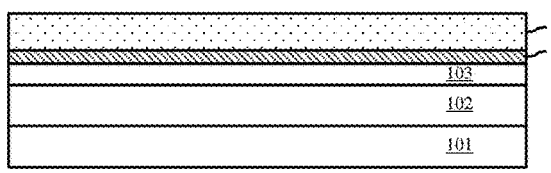
FIGS. 2A-2C are cross-section diagrams illustrating three different partially completed structures, respectively, formed according to process flow A or B.
Figure 2B:
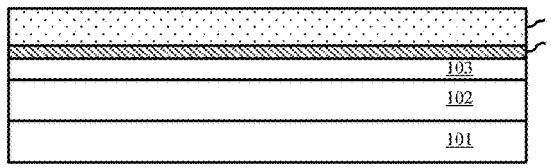
Figure 2C:
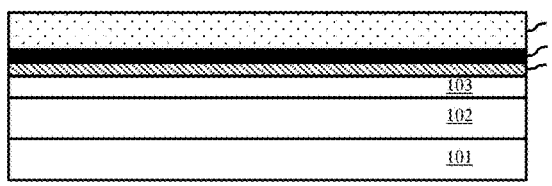

As mentioned above, in each of the method embodiments, a stack of layers required for transistor formation can be formed (see process step 10 and FIGS. 2A-2C). The specific layers included in the stack can differ slightly, depending upon whether the transistor is going to be a HEMT, a MISHEMT where a conformal gate dielectric layer will be deposited into a gate opening (referred to herein as MISHEMT #1), or a MISHEMT where a gate dielectric layer is built-in to the stack (referred to herein as MISHEMT #2).

Specifically, formation of a HEMT, a MISHEMT #1 or a MISHEMT #2, the stack of layers formed at process step 10 can include a substrate 101. This substrate 101 can be, for example, a silicon or silicon-based substrate (e.g., a silicon carbide (SiC) substrate), a sapphire substrate, a III-V semiconductor substrate (e.g., a gallium nitride (GaN) substrate or other suitable III-V semiconductor substrate) or any other suitable substrate for a III-V semiconductor device.

For formation of a HEMT, a MISHEMT #1 or a MISHEMT #2, the stack of layers formed at process step 10 can further include multiple epitaxially grown layers. The epitaxially grown layers can include a buffer layer 102, which is epitaxially grown on the top surface of the substrate 101. Such a buffer layer 102 can be employed as an anchor to achieve nucleation and to duplicate orientation in subsequently grown epitaxial layers. This buffer layer 102 can be doped or undoped. Optionally, the buffer layer 102 can be carbon-doped. The epitaxially grown layers can also include a channel layer 103 and, more particularly, a III-V semiconductor channel layer, which is epitaxially grown on the top surface of the buffer layer 102 and which will be employed as the device channel layer. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). It should be noted that the buffer layer 102 can also be employed to allow the channel layer 103 to be grown and to provide for lattice constants of the substrate 101 below and the channel layer 103 above. The epitaxially grown layers can further include a barrier layer 104, which is epitaxially grown on the top surface of the III-V semiconductor channel layer 103. The barrier layer 104 can have a band gap that is wider than the bandgap of the III-V semiconductor channel layer 103 for the device channel. Those skilled in the art will recognize that the barrier and channel materials can be selected so that a heterojunction is formed at the interface between the two layers, thereby resulting in the formation of a two-dimensional electron gas (2DEG) in the channel layer 103. This 2DEG in the channel layer 103 can provide the conductive pathway for the drifting of charges between the source and the drain.

In some embodiments, the buffer layer 102 could be, for example, a gallium nitride (GaN) buffer layer, an aluminum nitride (AlN) buffer layer, or a buffer layer of any other material suitable for use as a buffer layer of a HEMT, a MISHEMT #1 or a MISHEMT #2. The III-V semiconductor channel layer 103 could be, for example, a gallium nitride (GaN) layer or a III-V semiconductor channel layer made of any other suitable III-V semiconductor compound suitable for use as a channel layer in such a transistor. Furthermore, the barrier layer 104 could be, for example, an aluminum gallium nitride (AlGaN) barrier layer, aluminum nitride (AlN) barrier layer or a barrier layer of any other material suitable for use as a barrier layer in such a transistor. Techniques for epitaxially growing such layers are well known in the art and, thus, the details thereof have been omitted from the specification in order to allow the reader to focus on the salient aspects of the disclosed embodiments.

In any case, the above-mentioned layers can be epitaxially grown by metal-organic chemical vapor deposition (MOCVD) or any other suitable technique (e.g., molecular beam epitaxy (MBE), hydride vapor phase epitaxy (HVPE), etc.).

For purposes of illustration, the figures and the description above depict the epitaxially grown layers in the stack (e.g., the buffer layer 102, the channel layer 103 and the barrier layer 104) as being single layered structures (i.e., comprising one layer of buffer material, one layer of channel material and one layer of barrier material). However, it should be understood that, alternatively, any one or more of the epitaxially grown layers in the stack could be multi-layered structures (e.g., comprising multiple sub-layers of different buffer materials, multiple sub-layers of different III-V semiconductor channel materials and/or multiple sub-layers of different barrier materials).

Optionally, for formation of a MISHEMT #2, the stack of layers formed at process step 10 can also include a gate dielectric layer 106 on the top surface of the barrier layer 104 (e.g., as shown in FIG. 2C). This gate dielectric layer 106 can be, for example, a silicon dioxide ($SiO_2$) layer, a high K dielectric layer or a layer of any other dielectric material suitable for use as a gate dielectric layer of a MISHEMT. Exemplary high-K dielectric materials that could be employed include, but are not limited to, a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.).

Finally, for formation of a HEMT, a MISHEMT #1 or a MISHEMT #2, the stack of layers formed at process step 10 can include a blanket dielectric layer 105 on the top surface of the barrier layer 104 (e.g., as shown in FIG. 2A or 2B) or, if applicable, on the top surface of the gate dielectric layer 106 (e.g., as shown in FIG. 2C). This blanket dielectric layer 105 can be, for example, a silicon nitride (SiN) layer, a silicon dioxide ($SiO_2$) layer, a low K dielectric layer, or a layer of any other suitable dielectric material. Exemplary low-K dielectric materials that could be employed include, but are not limited to, silicon-boron-carbon-nitride (SiBCN), silicon-oxygen-carbon-nitride (SiONC), silicon-carbon-nitride (SiCN), silicon oxycarbide (SiCO), and hydrogenated silicon oxycarbide (SiCOH).

The method embodiments can further include forming a transistor (e.g., a HEMT, a MISHEMT #1 or a MISHEMT #2) using the stack (see process step 12 and FIG. 1B).

Figure 3A:
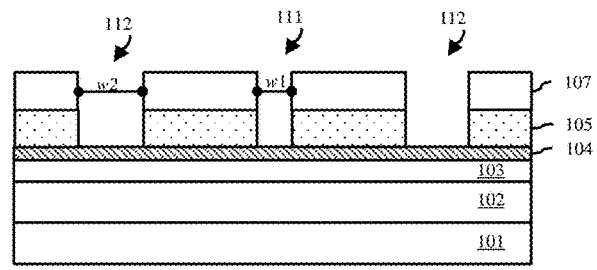
FIGS. 3A-3C are cross-section diagrams illustrating three different partially completed structures, respectively, formed according to process flow A or B.
Figure 3B:
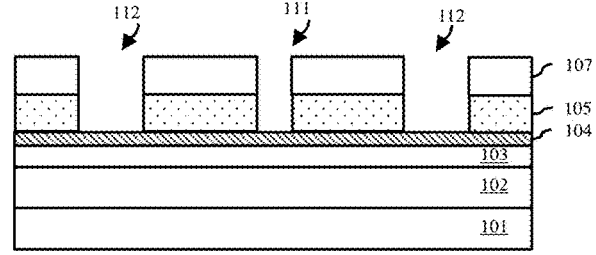
Figure 3C:
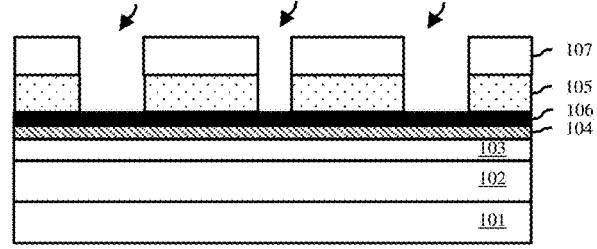

Specifically, to form a HEMT, a MISHEMT #1 or a MISHEMT #2, multiple openings, including source/drain openings 112 and a gate opening 111 positioned laterally between the gate opening 111 can be formed in the dielectric layer 105 (see process step 20 and FIGS. 3A-3C). For example, a mask layer 107 can be formed on the top surface of the dielectric layer 105. A pattern of openings can be formed (e.g., using conventional lithographic patterning and etch processes) in the mask layer 107. The pattern can specifically include a gate opening 111 positioned laterally between source/drain openings 112.

Optionally, the gate opening 111 can be patterned so that it is narrower than the source/drain openings 112, as illustrated. For example, the gate opening 111 can have a first width (w1) and the source/drain openings 112 can have a second width (w2) that is greater than the first width (w1). Alternatively, first width (w1) of the gate opening 111 could be equal to or greater than the second width (w2) of the source/drain openings. Subsequently, this pattern of a gate opening 111 and source/drain openings 112 can be transferred (e.g., using an anisotropic etch process) into the stack of layers below and, particularly, through only the dielectric layer 105 to the desired final depth for the gate opening 111 for the gate terminal. The anisotropic etch process used for gate and source/drain opening formation can be selective for the dielectric material of the dielectric layer 105 such that etching stops on the barrier layer 104 (e.g., as illustrated in FIGS. 3A and 3B). In the case of a MISHEMT #2 where the gate dielectric layer 106 is embedded in the stack, the gate dielectric layer 106 can be made of different dielectric material than the dielectric layer 105 and the anisotropic etch process can be selective for the dielectric material of the dielectric layer 105 such that etching stops on the gate dielectric layer 106 (e.g., as illustrated in FIG. 3C).

It should be noted that, optionally, instead of including a discrete gate dielectric layer 106 in the stack (e.g., as shown in FIG. 2C), a relatively thick blanket dielectric layer 105 (e.g., a silicon dioxide layer) could be used. In this case, the anisotropic etch process used for gate and source/drain opening formation could be timed so that etching stops some distance above the barrier layer 104 and the remaining lower portion of the dielectric layer 105 at the bottom of the gate opening can subsequently function as the gate dielectric. However, process control issues make this option less than ideal. In any case, the same mask layer 107 is used to concurrently pattern the gate opening 111 and the source/drain openings 112 into the dielectric layer 105. Furthermore, the gate opening 111 and source/drain openings 112 are etched to the same depth (e.g., to the bottom of the dielectric layer 105, as shown in FIGS. 3A-3C). Then, the mask layer 107 can be selectively removed.

Once the gate opening 111 and the source/drain openings 112 are formed at process step 20, some method embodiments can proceed with additional process steps as set forth in process flow A.

Figure 4A:
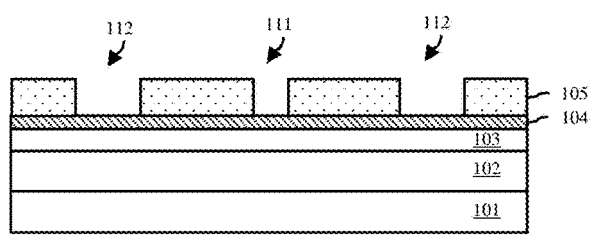
FIGS. 4A-4C are cross-section diagrams illustrating three different partially completed structures, respectively, formed according to process flow A.
Figure 4B:
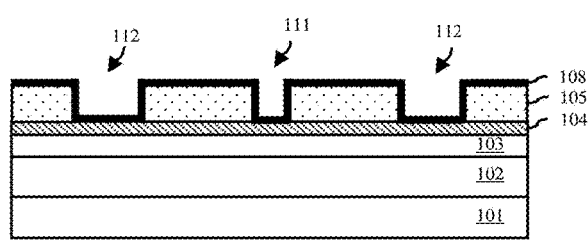
Figure 4C:
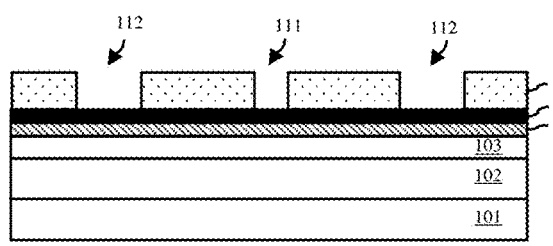

Referring specifically to process flow A, for formation of a MISHEMT #1 where the gate dielectric layer is not embedded into the stack, a conformal gate dielectric layer 108 can be deposited so as to cover the top surface of the dielectric layer 105 and line all of the openings (i.e., the gate opening 111 and the source/drain openings 112) (see FIG. 4B). This gate dielectric layer 108 can be, for example, a silicon dioxide ($SiO_2$) layer, a high K dielectric layer or a layer of any other dielectric material suitable for use as a gate dielectric layer of a MISHEMT. Exemplary high-K dielectric materials that could be employed include, but are not limited to, a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.). Conformal deposition of a gate dielectric layer is not necessary for formation of a HEMT (see FIG. 4A) or for formation of a MISHEMT when the gate dielectric layer is embedded in the stack (see FIG. 4C).

Figure 5A:
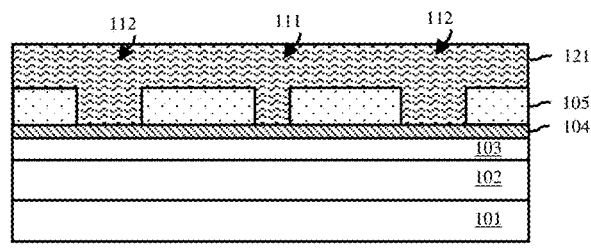
FIGS. 5A-5C are cross-section diagrams illustrating three different partially completed structures, respectively, formed according to process flow A.
Figure 5B:
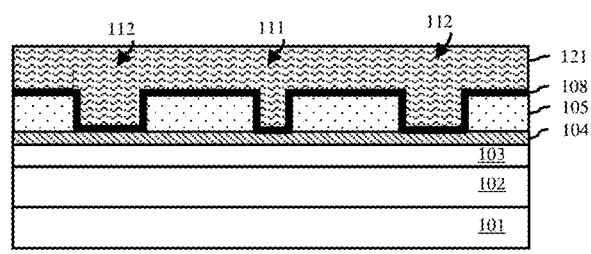
Figure 5C:
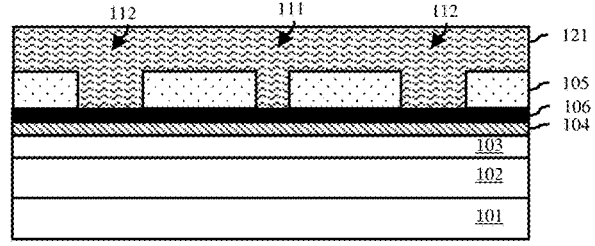

Next, a layer of gate conductor material 121 can be deposited over the partially completed structure (see process step 30 and FIGS. 5A-5C). Specifically, the layer of the gate conductor material 121 can be deposited so as to cover the top of the partially completed structure and further so as to completely fill all the openings (i.e., the gate opening 111 and the source/drain openings 112). This layer of the gate conductor material 121 will subsequently be patterned at process step 31, discussed below, to form a gate terminal 131 (or primary body thereof). For illustration purposes, the figures and the description depict this layer of the first conductor material 121 as being a single layered structure (i.e., comprising one layer of gate conductor material). However, it should be understood that, alternatively, this layer of gate conductor material 121 could be multi-layered structure (i.e., comprising multiple sub-layers of different gate conductor materials). Additionally, it should be noted that, at process step 30, the types of conductor material(s) used for the gate conductor material 121 can vary depending upon whether formation is of a HEMT (which requires that the gate terminal be a Schottky contact) or a MISHEMT #1 or a MISHEMT #2 (which does not require that the gate terminal to be a Schottky contact).

For example, for formation of a HEMT, which does not require a gate dielectric layer, the layer of the gate conductor material 121 can be deposited so that it is immediately adjacent to the top surface of the dielectric layer 105, so that it is immediately adjacent to vertical surfaces of the dielectric layer 105 at the sidewalls of the openings (i.e., at the sidewalls of the gate opening 111 and the source/drain openings 112), and further so that it is immediately adjacent to the barrier layer 104 at the bottom of the openings (see FIG. 5A). The gate conductor material 121 will subsequently be patterned to form a Schottky contact gate terminal, which will control a two-dimensional electron gas (2DEG) under the gate. Thus, the gate conductor material 121 must include metal(s) or metal alloy(s) that will form such a Schottky contact (i.e., a potential energy barrier for electrons) at the metal-semiconductor junction at the bottom of the gate opening. Exemplary metals or metal alloys that can be employed for a Schottky contact gate terminal include, but are not limited to, gold (Au), titanium (Ti), nickel-gold (Ni—Au), or titanium-platinum-gold (Ti/Pt/Au).

For formation of a MISHEMT #1 or a MISHEMT #2, the layer of gate conductor material 121 can be deposited so that it is immediately adjacent to either a conformally deposited gate dielectric layer 108 (see FIG. 5B) or a built-in gate dielectric layer 106 (see FIG. 5C). Thus, in these devices, the layer of gate conductor material will be physically separated from the barrier layer 104 at the bottoms of the gate opening 111 and the source/drain openings 112 by gate dielectric material. Since the formation of a Schottky contact gate terminal is not required for MISHEMTs, the gate conductor material 121 could include one layer or multiple sub-layers of any suitable gate conductor material (e.g., gate metal(s), gate metal alloy(s), doped polysilicon, etc.).

Figure 6A:
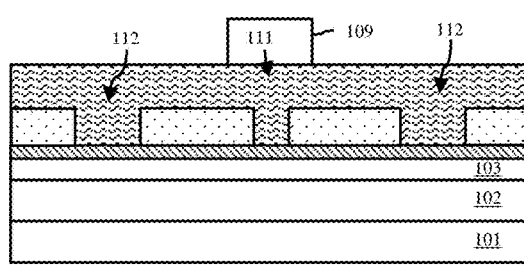
FIGS. 6A-6C are cross-section diagrams illustrating three different partially completed structures, respectively, formed according to process flow A.
Figure 6B:
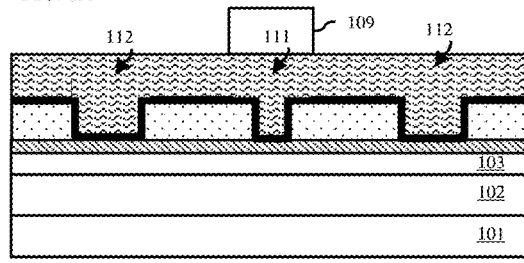
Figure 6C:
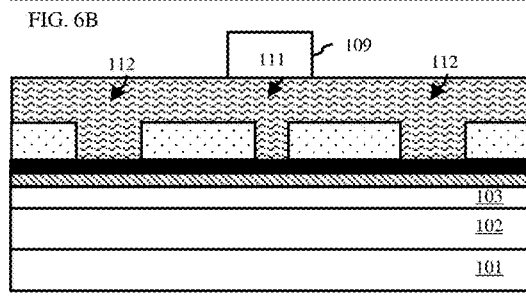

In any case, the layer of gate conductor material 121 can be patterned to form the gate terminal 131 (or the primary body thereof) (see process step 31). Specifically, a mask layer 109 can be formed on the top surface of the layer of gate conductor material 121 (see FIGS. 6A-6C). The mask layer 109 can be patterned (e.g., using conventional lithographic patterning and etch processes) so that the portion of the layer of the gate conductor material aligned above the gate opening 111 is masked (i.e., protected) and so that the portions of the layer of the gate conductor material 121 aligned above the source/drain openings 112 are exposed (i.e., unmasked, unprotected, etc.). The pattern of the mask layer 109 can then be transferred into the layer of the gate conductor material 121 (e.g., using a selective anisotropic etch process). This selective anisotropic etch process can result in a first gate section 131a of a gate terminal 131 within the gate opening 111 and a second gate section 131b of the gate terminal 131 above the gate opening 111 and, more particularly, above and immediately adjacent to the first gate section 131a so as to be above the level of the top surface of the dielectric layer 105. Optionally, the layer of the gate conductor material 121 can specifically be patterned so that the second gate section 131b is wider than the first gate section 131a and, thus, so that the second gate section 131b extends laterally onto the top surface of the dielectric layer 105. Thus, the patterned gate conductor material for the gate terminal 131 could be, for example, T-shaped, inverted L-shaped, etc. In any case, this patterning of the layer of the gate conductor material 121 can be performed so that the source/drain openings 112 and the top surface of the dielectric layer 105 surrounding the source/drain openings 112 are also exposed. It should be understood that if the layer of gate conductor material is a multi-layered structure, multiple selective anisotropic etch processes would be employed so that the gate conductor material(s) are completely removed from the source/drain openings 112 and from top surface of the dielectric layer 105 adjacent to the source/drain openings. Furthermore, the specifications for the selective anisotropic etch process(es) may vary depending upon the type of gate conductor material(s) used in so that etching essentially stops without significantly impacting materials exposed during removal of the gate conductor material(s) 121.

For formation of a HEMT, process step 31 will result in the top surface of the barrier layer 104 being exposed at the bottom of the source/drain openings 112. For formation of a MISHEMT #1 where a gate dielectric layer 108 was conformally deposited prior to deposition of the layer of gate conductor material 121 at process step 30, process step 31 will result in exposure of the gate dielectric layer 108 lining the source/drain openings 112. For formation of a MISH- EMT #2 where a gate dielectric layer 106 is embedded in the stack, process step 31 will result in the top surface of the gate dielectric layer 106 being exposed at the bottom of the source/drain openings 112.

Figure 7A:
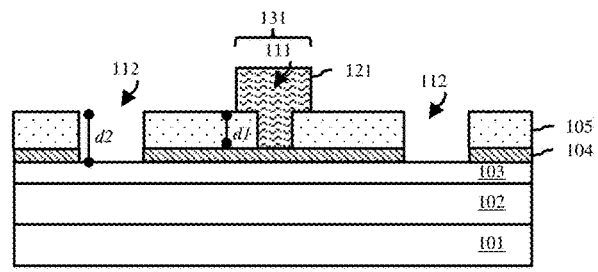
FIGS. 7A-7C are cross-section diagrams illustrating three different partially completed structures, respectively, formed according to process flow A.
Figure 7B:
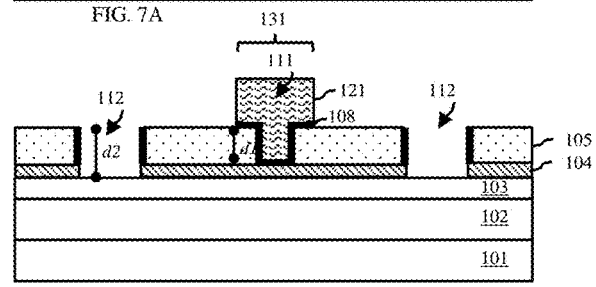
Figure 7C:
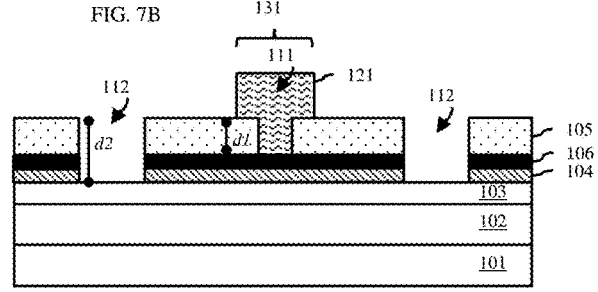

The source/drain openings 112 can then be extended down deeper into the stack and, more particularly, down to the channel layer 103 (see process step 32 and FIGS. 7A-7C).

For formation of a HEMT, process step 32 can include a selective anisotropic etch process to etch through the barrier layer 104 at the bottom of the source/drain openings 112 in order to expose the top surface of the channel layer 103 (see FIG. 7A).

For formation of a MISHEMT #1 where a gate dielectric layer 108 lines the gate opening 111 and the source/drain openings 112, process step 32 can include multiple selective etch processes. For example, a first selective anisotropic etch process can be performed to remove exposed horizontal portions of the gate dielectric layer 108 and, thereby expose the top surface of the dielectric layer 105 around the source/drain openings 112 as well as the top surface of the barrier layer 104 at the bottom of the source/drain openings 112. Then, a second selective anisotropic etch process can be performed to etch through the barrier layer 104 at the bottom of the source/drain openings 112 in order to expose the top surface of the channel layer 103 (see FIG. 7B). Thus, as illustrated in FIG. 7B, the sidewalls of the upper sections of the source/drain openings 112 within the dielectric layer 105 will remain covered by the gate dielectric layer 108. Alternatively, the selective etch of the gate dielectric layer 108 within the source/drain openings 112 (prior to the selective anisotropic etch of the barrier layer 104) could be a selective isotropic etch process, which completely removes the gate dielectric material from the source/drain openings 112 (not shown). For purposes of illustration, all subsequent process steps for the MISHEMT #1 are shown with respect to the partially completed structure shown in FIG. 7B and, thus, the final MISHEMT #1 structures are shown in FIGS. 9B, 10B, 11B, 12B, 13B and 14B as having gate dielectric material within the source/drain openings 112. However, it should be understood that the same process steps could be performed with respect to a partially completed structure where the gate dielectric material has been completely removed from the source/drain openings 112 by a selective isotropic etch process such that any of the final MISHEMT #1 structures disclosed herein and discussed below could also be completely devoid of the gate dielectric material.

For formation of a MISHEMT #2 where a gate dielectric layer 106 is embedded in the stack, process step 32 can also include multiple selective anisotropic etch processes. Specifically, a first selective anisotropic etch process can be performed to etch through the gate dielectric layer 106 at the bottom of the source/drain openings 112 to expose the top surface of the barrier layer 104. Then, a second selective anisotropic etch process can be performed to etch through the barrier layer 104 at the bottom of the source/drain openings 112 in order to expose the top surface of the channel layer 103 (see FIG. 7C). It should be understood that the selective anisotropic etch process(es) mentioned above may vary depending upon the type of gate dielectric (if applicable) and barrier materials used so that etching essentially stops without significantly etching other exposed materials or the channel layer 103 during extension of the source/drain openings 112. Thus, following process step 32, the gate opening 111 will extend a first depth (d1) into the stack from the top surface of the dielectric layer 105 and the source/drain openings 112 will extend a second depth (d2) into the stack, which is greater than the first depth (d1), from the top surface of the dielectric layer 105.

Figure 8A:
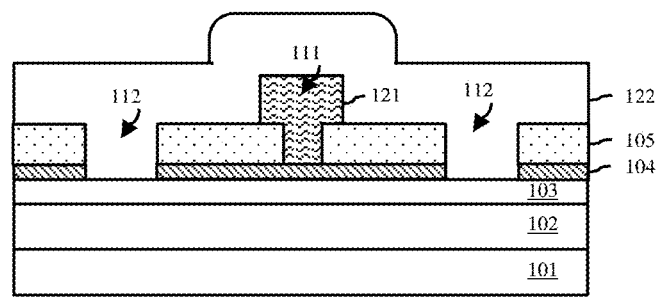
FIGS. 8A-8C are cross-section diagrams illustrating three different partially completed structures, respectively, formed according to process flow A.
Figure 8B:
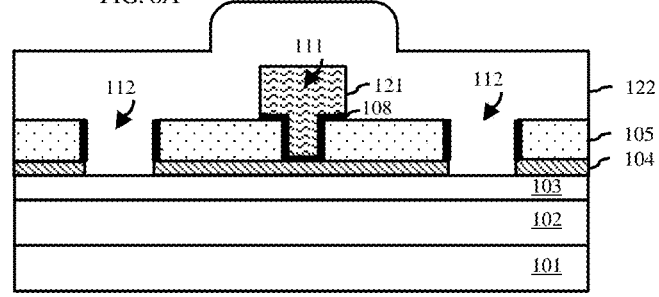
Figure 8C:
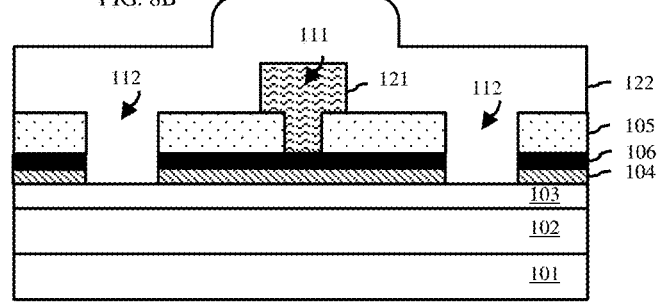
Figures 9A, 9B, 9C:
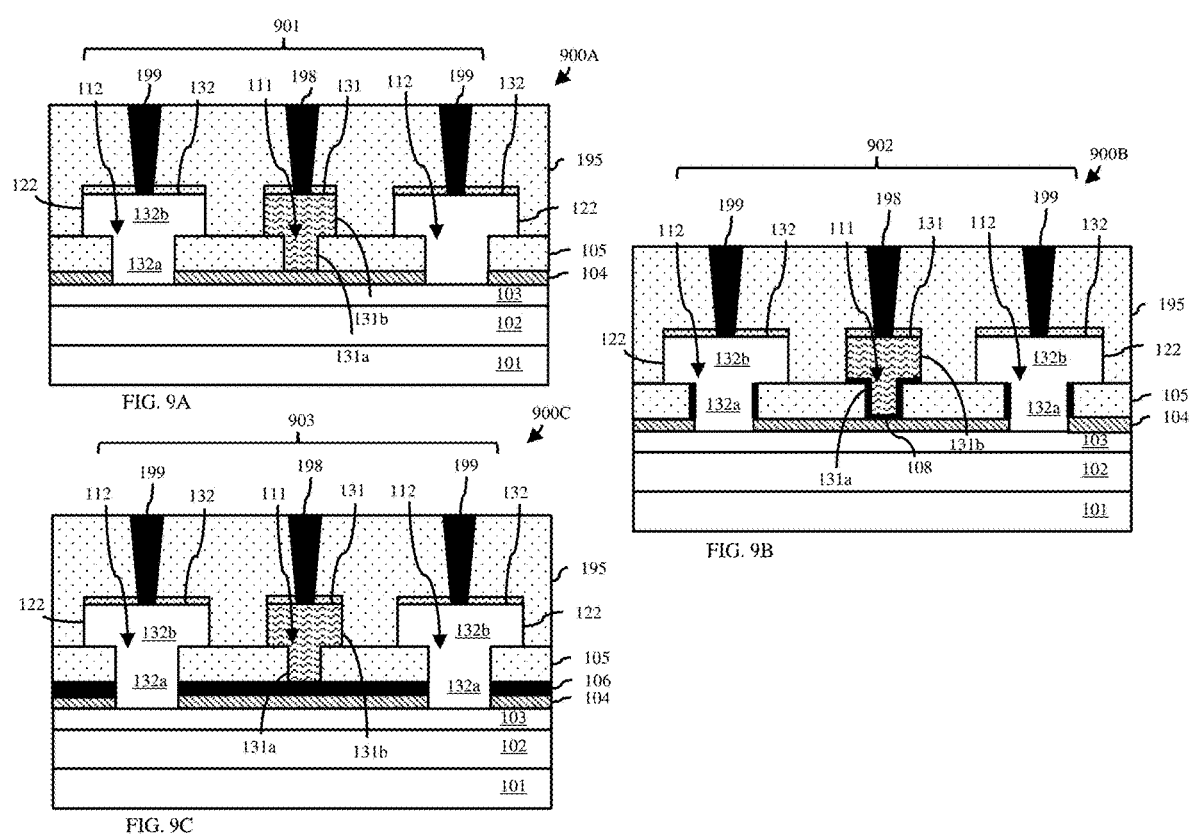
FIGS. 9A-9C are cross-section diagrams illustrating embodiments of a HEMT, a MISHEMT and another MISHEMT, respectively, formed according to process flow A.

Next, a layer of a source/drain conductor material 122 can be deposited onto the top surface of the dielectric layer 105 adjacent to the source/drain openings 112, into the source/drain openings 112 so that it is immediately adjacent to the channel layer 103 and so that it completely fills the source/drain openings 112, and further over the second gate section 131b of the gate terminal 131 (see process step 33 and FIGS. 8A-8C). For illustration purposes, the drawings and the description depict the layer of the source/drain conductor material 122 as being a single layered structure (i.e., comprising one layer of conductor material). However, it should be understood that, alternatively, this layer of source/drain conductor material 122 could be multi-layered structure (i.e., comprising multiple sub-layers of different conductor materials). For transistors such as a HEMT, a MISHEMT #1 or a MISHEMT #2, the source/drain terminals 132 should be ohmic contact source/drain terminals at the metal-semiconductor junction at the bottom of the source/drain openings 112. Thus, exemplary metals or metal alloys that can be employed for the source/drain conductor material 122 include, but are not limited to, Ti/Al/TiN, Ti/Al/Ti/Au or Mo/Al/Mo/Au.

The layer of source/drain conductor material 122 can optionally be polished (see process step 34). The layer of source/drain conductor material 122 can further be patterned to form source/drain terminals 132, where each source/drain terminal 132 includes a first source/drain section 132a within a source/drain opening 112 and a second source/drain section 132b above the source/drain opening 112 and, more particularly, above and immediately adjacent to the first source/drain section 132a so as to be above the level of the top surface of the dielectric layer 105 (see process step 35). Optionally, patterning can be performed at process step 35 such that in each source/drain terminal 132, the second source/drain section 132b is wider than the first source/drain section 132a such that it extends laterally onto the top surface of the dielectric layer 105. Thus, the patterned source/drain conductor material 122 for each source/drain terminal 132 could be, for example, T-shaped, inverted L-shaped, etc.

More specifically, optionally, a conventional CMP process can be performed at process step 34. Whether or not the CMP process is performed, patterning of the layer of source/drain conductor material 122 can proceed by using conventional lithographic patterning and etch processes. For example, a mask layer can be formed on the layer of the source/drain conductor material 122. The mask layer can be patterned into a first mask section aligned above the gate opening 111 and second mask sections aligned above the source/drain openings 112. The width of the first mask section can be less than, the same as, or wider than the second gate section 131b of the previously patterned gate conductor material. Next, the pattern of this mask layer can be transferred into the layer of the source/drain conductor material 122 (e.g., using a selective anisotropic etch process). It should be understood that if the layer of source/drain conductor material 122 is a multi-layered structure, multiple selective anisotropic etch processes can be employed. Furthermore, the specifications for the selective anisotropic etch process(es) may vary depending upon the type of conductor material(s) used for the source/drain conductor material 122 so that etching essentially stops without significantly impacting materials exposed during the patterning of the source/drain conductor materials 122. Following patterning of the layer of the source/drain conductor material 122, additional processing can be performed in order complete the HEMT or MISHEMT structures (see process step 36). This additional processing can include, but is not limited to, deposition of one or more additional dielectric layers 195 (e.g., an optional conformal etch stop layer, an interlayer dielectric layer, etc.) over the partially completed structure, formation of middle of the line (MOL) contacts (e.g., see MOL contact 198 to the gate terminal 131 and MOL contacts 199 to the source/drain terminals 132), etc.

It should be noted that the resulting structure from process flow A and, particularly, the configuration of the gate terminal 131 in transistor will vary depending upon several factors. For example, the configuration of the gate terminal will depend upon whether or not the optional CMP is performed at process step 34 and, if so, whether or not the top surface of the second gate section 131b of the gate terminal 131 is exposed by the CMP. The configuration of the gate terminal 131 will also depend upon how the layer of the source/drain conductor material 122 is actually patterned and, more particularly, whether or not sidewalls of the second gate section 131b of the gate terminal 131 are exposed during the patterning process.

For example, a CMP of the source/drain conductor material 122 could be performed at process step 34 such that the top surfaces of the gate terminal 131 and the source/drain terminals 132 are co-planar and so that the top surface of the second gate section 131b is exposed. Subsequently, the layer of the source/drain conductor material 122 could be patterned at process step 35 so that the sidewalls of the second gate section 131b are also exposed (e.g., see the HEMT 901, the MISHEMT 902 or the MISHEMT 903 in the semiconductor structures 900A-900C of FIGS. 9A-9C, respectively).

Alternatively, a CMP of the source/drain conductor material 122 could be performed at process step 34 such that the top surfaces of the gate terminal 131 and the source/drain terminals 132 are co-planar and so that the top surface of the second gate section 131b is exposed. Subsequently, the layer of the source/drain conductor material 122 could be patterned at process step 35 so that the sidewalls of the second gate section 131b are not exposed. Thus, in the HEMT 1001, the MISHEMT 1002 and the MISHEMT 1003 in the semiconductor structures 1000A-1000C of FIGS. 10A-10C, respectively, the gate terminal 131 further includes an additional gate section 131c, which is made of the source/drain conductor material 122 and which is positioned laterally immediately adjacent to the sidewalls of the second gate section 131b.

Alternatively, a CMP of the source/drain conductor material 122 could be performed at process step 34 such that the top surfaces of the gate terminal 131 and the source/drain terminals 132 are co-planar but so that the top surface of the second gate section 131b is not exposed (e.g., if the layer of source/drain conductor material is thicker than the height of the second gate section). Subsequently, the layer of the source/drain conductor material 122 could be patterned at process step 35 so that the sidewalls of the second gate section 131b are exposed. Thus, in the HEMT 1101, the MISHEMT 1102 and the MISHEMT 1103 in the semiconductor structures 1100A-1100C of FIGS. 11A-11C, respectively, the gate terminal 131 further includes an additional gate section 131c, which is made of the source/drain conductor material 122 and which is immediately adjacent to the top surface of the second gate section 131b.

Figure 12A:
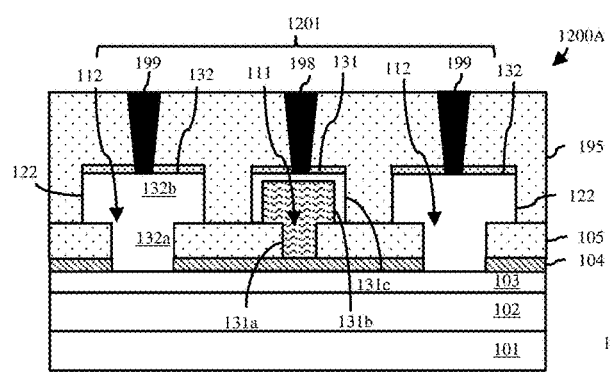
FIGS. 12A-12C are cross-section diagrams illustrating alternative embodiments of a HEMT, a MISHEMT and another MISHEMT, respectively, formed according to process flow A.
Figure 12B:
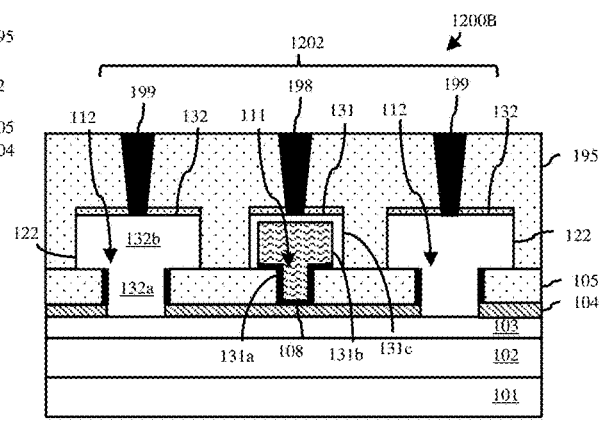
Figure 12C:
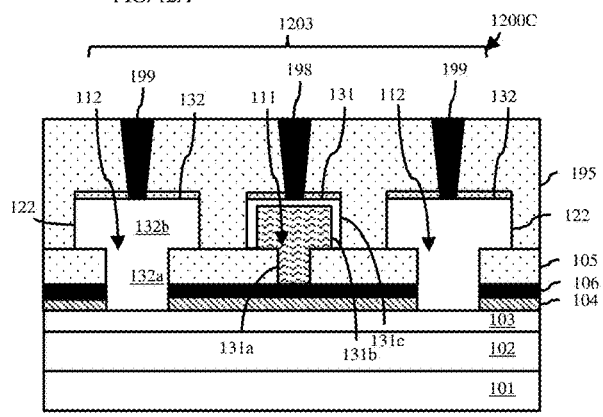

Alternatively, a CMP of the source/drain conductor material 122 could be performed at process step 34 such that the top surfaces of the gate terminal 131 and the source/drain terminals 132 are co-planar but so that the top surface of the second gate section 131b is not exposed. Subsequently, the layer of the source/drain conductor material 122 could be patterned at process step 35 so that the sidewalls of the second gate section 131b are also not exposed. Thus, in the HEMT 1201, the MISHEMT 1202 and the MISHEMT 1203 in the semiconductor structures 1200A-1200C of FIGS. 12A-12C, respectively, the gate terminal 131 further includes an additional gate section 131c, which is made of the source/drain conductor material 122 and which is immediately adjacent to both the top surface and the sidewalls of the second gate section 131b.

Figure 13A:
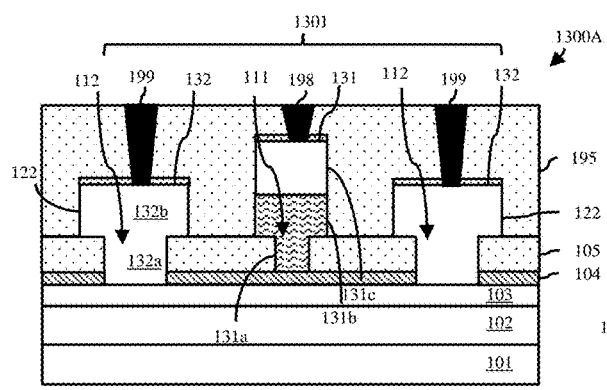
FIGS. 13A-13C are cross-section diagrams illustrating alternative embodiments of a HEMT, a MISHEMT and another MISHEMT, respectively, formed according to process flow A.
Figure 13B:
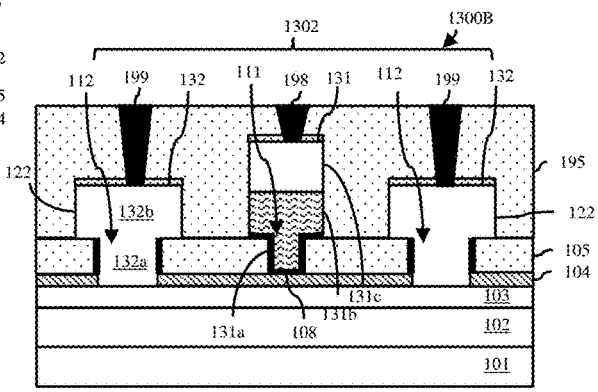
Figure 13C:
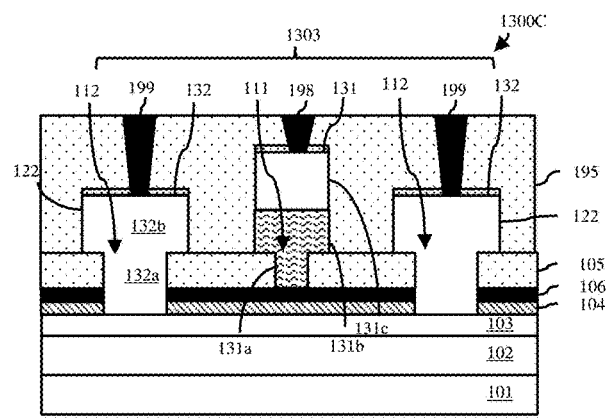

Alternatively, a CMP of the source/drain conductor material 122 may be skipped at process step 34 such that the top surface of the gate terminal 131 is above the level of the top surfaces of the source/drain terminals 132 and, thus, so that the top surface of the second gate section 131b remains covered by the source/drain conductor material 122. Subsequently, the layer of the source/drain conductor material 122 could be patterned at process step 35 so that the sidewalls of the second gate section 131b are exposed. Thus, in the HEMT 1301, the MISHEMT 1302 and the MISHEMT 1303 in the semiconductor structures 1300A-1300C of FIGS. 13A-13C, respectively, the gate terminal 131 further includes an additional gate section 131c, which is made of the source/drain conductor material 122 and which is immediately adjacent to the top surface of the second gate section 131b.

Alternatively, a CMP of the source/drain conductor material 122 may be skipped at process step 34 such that the top surface of the gate terminal 131 is above the level of the top surfaces of the source/drain terminals 132 and, thus, so that the top surface of the second gate section 131b remains covered by the source/drain conductor material 122. Subsequently, the layer of the source/drain conductor material 122 can be patterned at process step 35 so that the sidewalls of the second gate section 131b are not exposed. Thus, in the HEMT 1401, the MISHEMT 1402 and the MISHEMT 1403 in the semiconductor structures 1400A-1400C of FIGS. 14A-14C, respectively, the gate terminal 131 further includes an additional gate section 131c, which is made of the source/drain conductor material 122 and which is immediately adjacent to both the top surface and sidewalls of the second gate section 131b.

Since in the above-described method embodiments that follow process flow A, the dielectric layer 105 is concurrently patterned with the gate opening 111 for the first gate section 131a of the gate terminal 131 and with the source/drain openings 112 for the first source/drain sections 132a of the source/drain terminals 132, those lower/first gate and source/drain sections 131a and 132a within the dielectric layer 105 are considered self-aligned. Furthermore, since patterning of the layer of the source/drain conductor material 122 to form the second source/drain sections 132b of the source/drain terminals 132 can also concurrently impacts the final shape of the second gate section 131b of the gate terminal 131, the upper-level sections of the gate and source/drain terminals (i.e., the second gate section 131b and the second source/drain sections 132b) which are all above the dielectric layer 105, are also considered self-aligned. With these multi-level self-aligned gate and source/drain terminals 131-132, fails related to terminal misalignment are avoided (e.g., as device sizes are reduced).

Referring again to the flow diagram of FIG. 1B, once the gate opening 111 and the source/drain openings 112 are formed at process step 20, other method embodiments can proceed with additional process steps as set forth in process flow B (as opposed to the additional process steps from process flow A discussed above). Process flow B is specifically different from process flow A with respect to when the source/drain openings are extended deeper into the stack of layers and with respect to the order within which the gate and source/drain conductor materials are deposited and patterned. However, it should be understood that the various materials use for components identified by the same reference number will be the same.

Figure 15A:
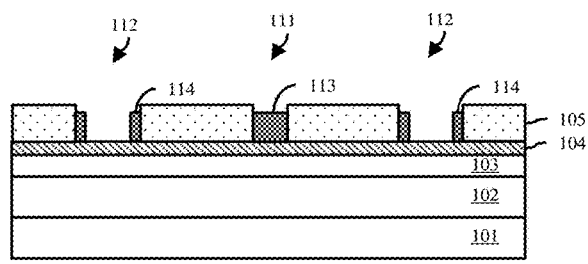
FIGS. 15A-15C are cross-section diagrams illustrating three different partially completed structures, respectively, formed according to process flow B.
Figure 15B:
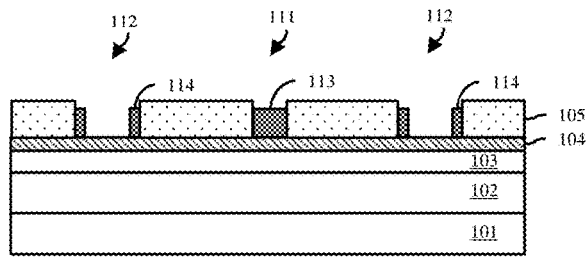
Figure 15C:
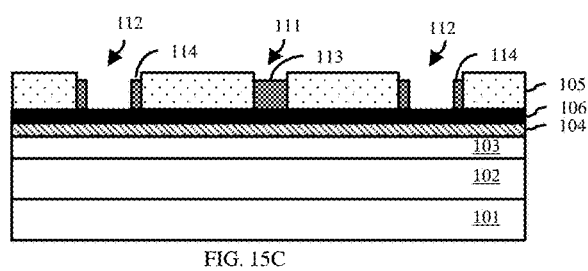

Specifically, process flow B can include forming a protective plug 113 in the gate opening 111 and sidewall spacers 114 in the source/drain openings 112 (see process step 40 and FIGS. 15A-15C). The protective plug 113 and the sidewall spacers 114 can, for example, be formed concurrently using a conventional sidewall spacer formation technique when the gate opening 111 is narrower than the source/drain openings 112. That is, a plug and spacer layer can be conformally deposited over the partially completed structure. Then, a selective anisotropic etch process can be performed so as to remove the plug and spacer layer from horizontal surfaces, leaving it on vertically surfaces. The thickness of the plug and spacer layer and the etch specifications used can be customized given the different widths of the gate opening 111 and the source/drain openings 112 so that remaining portions of the plug and spacer layer form a plug 113, which fills at least a lower portion of the gate opening 111, and sidewall spacers 114, which are positioned laterally adjacent to the sidewalls of the source/drain openings 112 such that at least a center area of the bottom surface of the each source/drain opening 112 remains exposed (e.g., a center area of the barrier layer 104 at the bottom of each source/drain opening 112, as shown in FIGS. 15A and 15B, or a center area of the gate dielectric layer 106 at the bottom of each source/drain opening 112, as shown in FIG. 15C). It should be noted that the plug and spacer layer can be made of polysilicon, an amorphous silicon, or any other suitable material that can be selectively etched during plug and sidewall spacer formation and also selectively removed during subsequent processing (as discussed below).

Figure 16A:
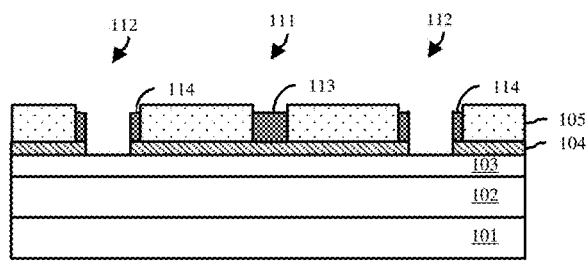
FIGS. 16A-16C are cross-section diagrams illustrating three different partially completed structures, respectively, formed according to process flow B.
Figure 16B:
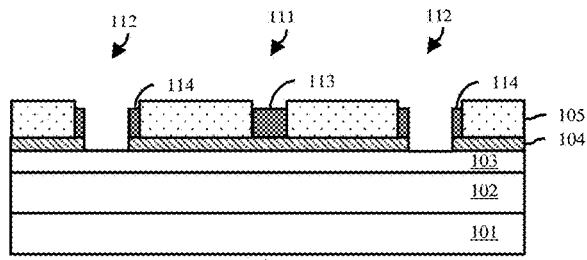
Figure 16C:
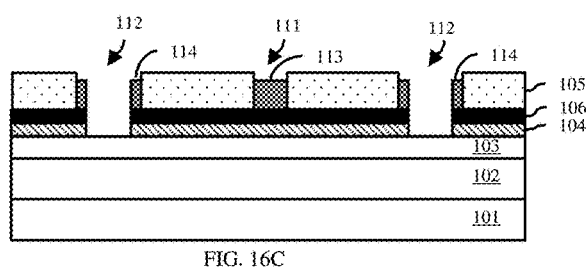

The source/drain openings 112 can then be extended deeper into the stack and, specifically, down to the channel layer 103 (see process step 41 and FIGS. 16A-16C).

Figure 17A:
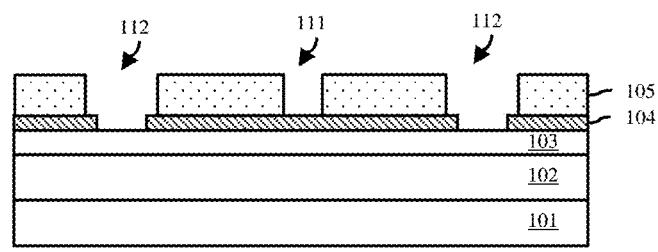
FIGS. 17A-17C are cross-section diagrams illustrating three different partially completed structures, respectively, formed according to process flow B.
Figure 17B:
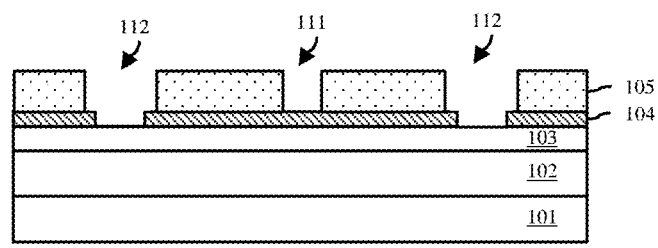
Figure 17C:
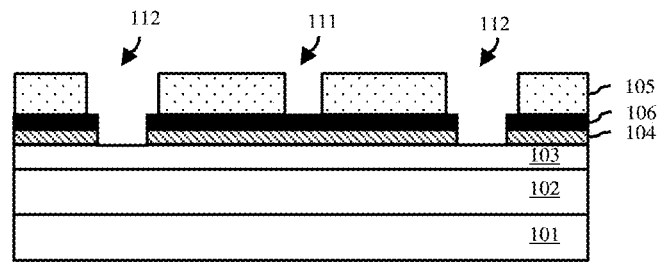

Optionally, the protective plug 113 and sidewall spacers 114 can be selectively removed at this point in the method (see process step 42 and FIGS. 17A-17C). It should be noted that FIGS. 18A-18C to FIGS. 22A-22C illustrate the remaining process steps 43-48 when the protective plug 113 and the sidewall spacers 114 have been removed at process step 42. FIGS. 23A-23C to FIGS. 25A-25C illustrate the remaining process steps 43-48 when the protective plug 113 and the sidewall spacers 114 have not been removed at process step 42.

Figure 18A:
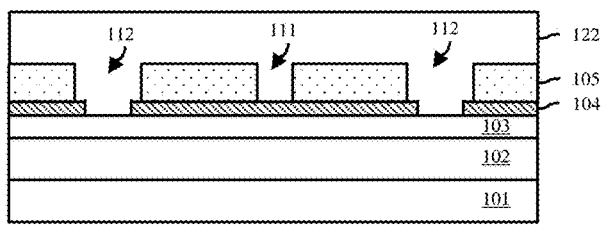
FIGS. 18A-18C are cross-section diagrams illustrating three different partially completed structures, respectively, formed according to process flow B.
Figure 18B:
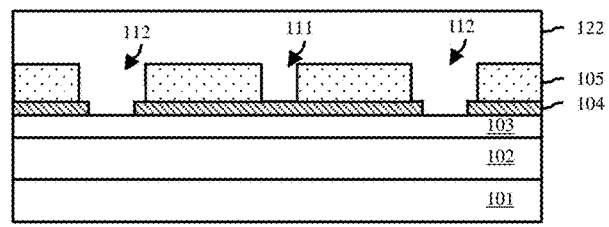
Figure 18C:
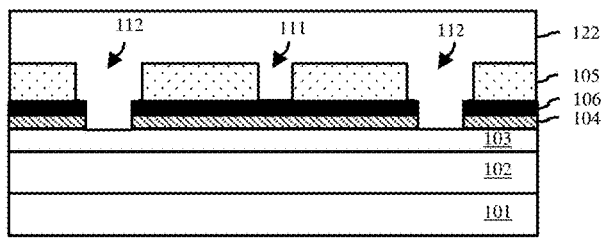
Figure 19A:
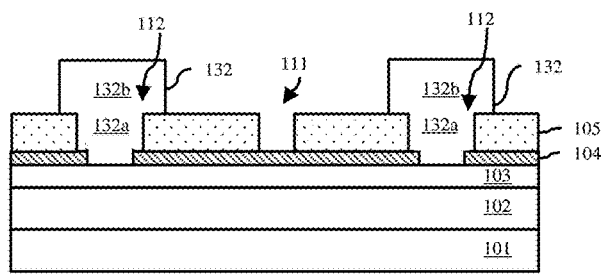
FIGS. 19A-19C are cross-section diagrams illustrating three different partially completed structures, respectively, formed according to process flow B.
Figure 19B:
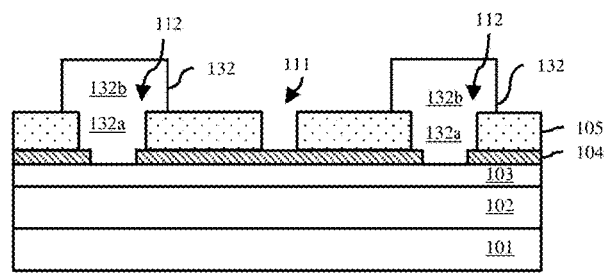
Figure 19C:
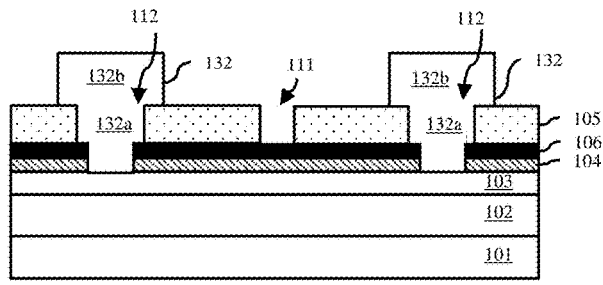

Specifically, after the protective plug 113 and sidewall spacers 114 have been selectively removed at process step 42, a layer of a source/drain conductor material 122 can be deposited over the partially completed structure (see process step 43 and FIGS. 18A-18C). The layer of source/drain conductor material 122 can be patterned (e.g., using conventional lithographic patterning and etch techniques) to form, for each of two source/drain terminals 132, a first source/drain section 132a within a source/drain opening 112 and a second source/drain section 132b above the source/drain opening 112 and, more particularly, above and immediately adjacent to the first source/drain section 132a so as to be above the level of the top surface of the dielectric layer 105 (see process step 44 and FIGS. 19A-19C). Optionally, the source/drain conductor material 122 can be patterned at process step 44 so that each second source/drain section 132b is wider than the first source/drain section 132a below and, thus, so that the second source/drain sections 132b extend laterally onto the top surface of the dielectric layer 105. Thus, the patterned source/drain conductor material 122 for the source/drain terminals 132 could be, for example, T-shaped, inverted L-shaped, etc. It should be noted that patterning of the layer of source/drain conductive material 122 should further be performed so as to also expose the gate opening 111. That is, any source/drain conductive material can be removed from the gate opening 111 and from the top surface of the dielectric layer 105 around the gate opening 111 during this patterning process.

Figure 20A:
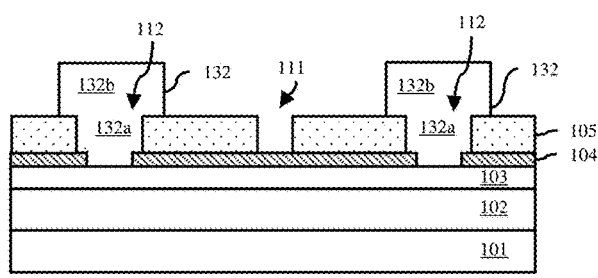
FIGS. 20A-20C are cross-section diagrams illustrating three different partially completed structures, respectively, formed according to process flow B.
Figure 20B:
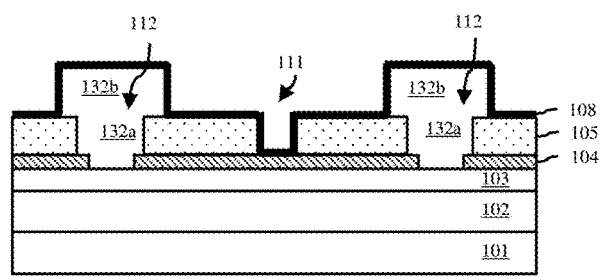
Figure 20C:
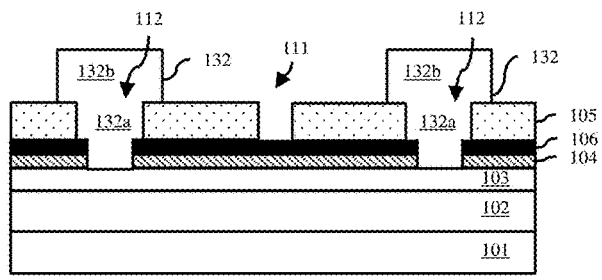
Figure 21A:
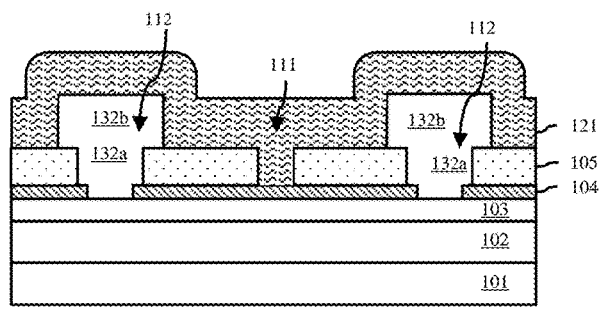
FIGS. 21A-21C are cross-section diagrams illustrating three different partially completed structures, respectively, formed according to process flow B.
Figure 21B:
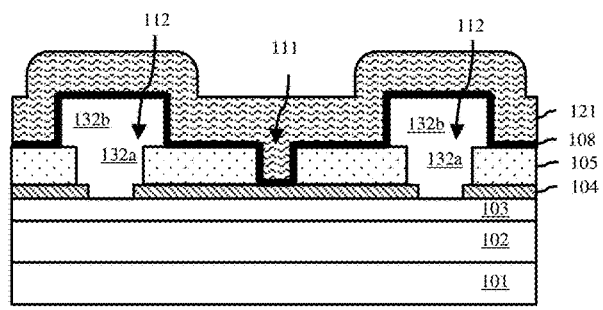
Figure 21C:
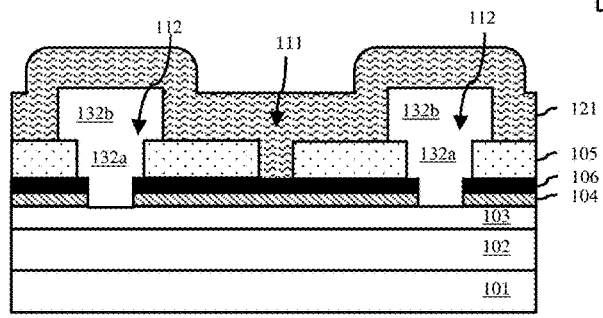
Figure 22A:
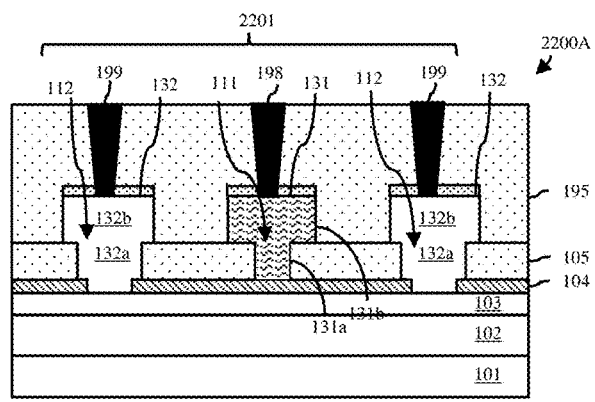
FIGS. 22A-22C are cross-section diagrams illustrating embodiments of a HEMT, a MISHEMT and another MISHEMT, respectively, formed according to process flow B.
Figure 22B:
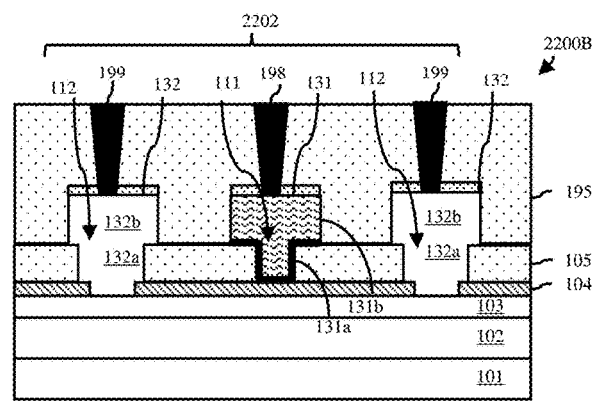
Figure 22C:
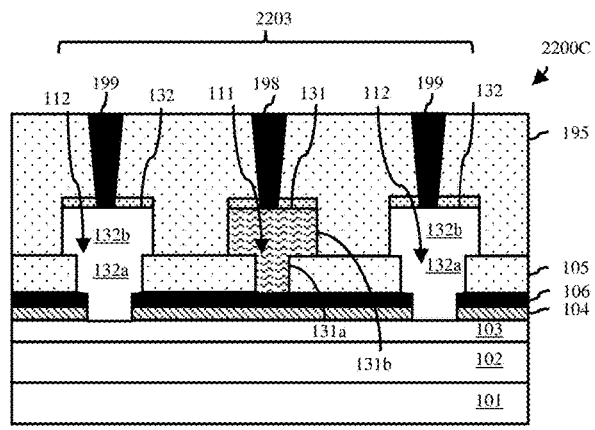
Figure 23A:
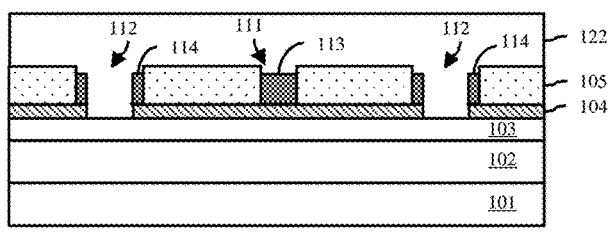
FIGS. 23A-23C are cross-section diagrams illustrating three different alternative partially completed structures, respectively, formed according to process flow B.
Figure 23B:
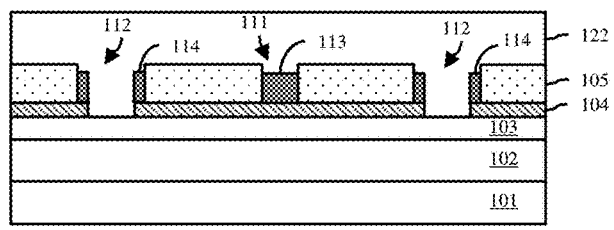
Figure 23C:
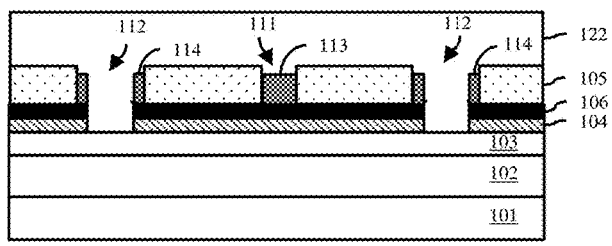

For a MISHEMT #2 only, a conformal gate dielectric layer 108 can then be deposited over the partially completed structure and specifically so that it lines the gate opening 111 (see FIGS. 20A-20C). Then, a layer of a gate conductor material 121, which is different from the source/drain conductor material 122, can be deposited over the partially completed structure (see process step 45 and FIGS. 21A-21C).

The layer of gate conductor material 121 can optionally be polished (see process step 46). Additionally, the layer of the gate conductor material 121 can be patterned to form, for a gate terminal 131, a first gate section 131a within the gate opening 111 and the second gate section 131b above the gate opening 111 and, more particularly, above and immediately adjacent to the first gate section 131a so as to be above the level of the top surface of the dielectric layer 105 (see process step 47 and FIGS. 22A-22C). Optionally, the layer of gate conductor material 121 can be patterned so that the second gate section 131b is wider than the first gate section 131a and, thus, so that the second gate section 131b extends laterally onto the top surface of the dielectric layer 105. Thus, the patterned gate conductor material for the gate terminal 131 could be, for example, T-shaped, inverted L-shaped, etc.

Following patterning of the layer of the source/drain conductor material 122, additional processing can be performed in order complete the HEMT or MISHEMT structures (see process step 48). This additional processing can include, but is not limited to, deposition of one or more additional dielectric layers 195 (e.g., an optional conformal etch stop layer, an interlayer dielectric layer, etc.) over the partially completed structure, formation of middle of the line (MOL) contacts (e.g., see MOL contact 198 to the gate terminal 131 and MOL contacts 199 to the source/drain terminals 132), etc.

Figure 24A:
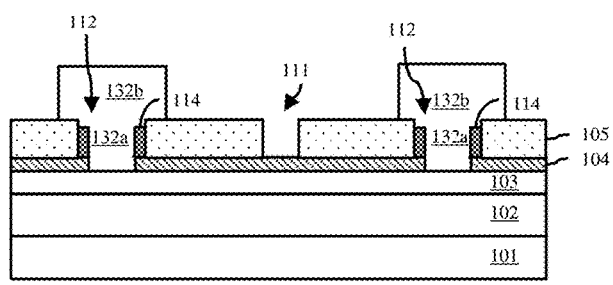
FIGS. 24A-24C are cross-section diagrams illustrating three different alternative partially completed structures, respectively, formed according to process flow B.
Figure 24B:
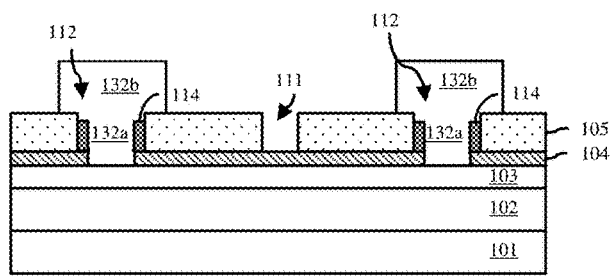
Figure 24C:
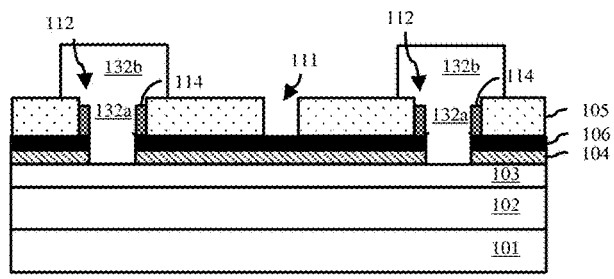
Figure 25A:
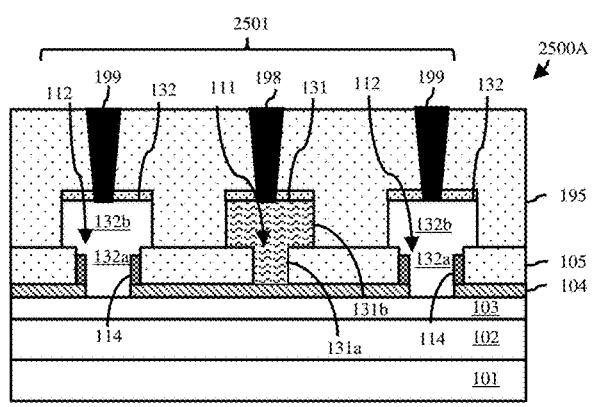
FIGS. 25A-25C are cross-section diagrams illustrating alternative embodiments of a HEMT, a MISHEMT and another MISHEMT, respectively, formed according to process flow B.
Figure 25B:
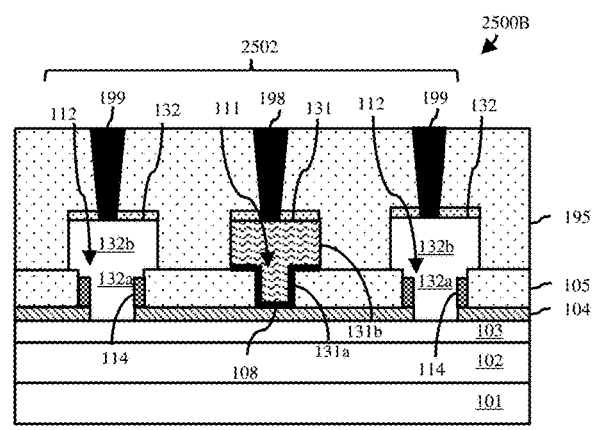
Figure 25C:
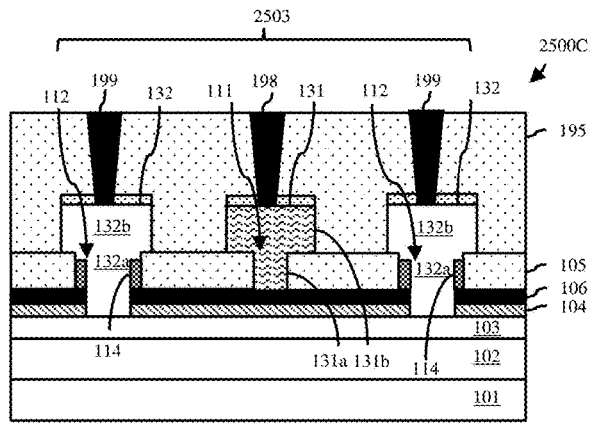

As mentioned above, removal of the protective plug 113 and sidewall spacers 114 at process step 42 could, alternatively, be skipped. In this case, at process step 43 the layer of a source/drain conductor material 122 can be deposited over the partially completed structure and, particularly, over the protective plug 113 within the gate opening 111 and into the source/drain openings 112 such that it covers and is positioned laterally between the sidewall spacers 114 (see FIGS. 23A-23C). The layer of source/drain conductor material 122 can then be patterned as described above at process step 44 to form, for each of two source/drain terminals 132, a first source/drain section 132a within a source/drain opening 112 and positioned laterally between the sidewall spacers 114 and a second source/drain section 132b above the source/drain opening 112 and, more particularly, above and immediately adjacent to the first source/drain section 132a so as to be above the level of the top surface of the dielectric layer 105 (FIGS. 24A-24C). In this case, patterning of the layer of source/drain conductive material 122 at process step 44 should further be performed so as to also expose the gate opening 111 by removing any source/drain conductive material from the gate opening 111 and from the top surface of the dielectric layer 105 around the gate opening 111 and further by removing the protective plug 113. Process steps 45-48 can proceed as described above (see FIGS. 25A-25C).

It should be noted that the resulting structures following process flow B and, particularly, the configuration of the source/drain terminals 132 in the resulting structure will vary depending upon several factors. For example, the configuration of the source/drain terminals will depend upon whether or not the optional CMP is performed at process step 46 and, if so, whether or not the top surface of the second source/drain section 132b of each source/drain terminal 132 is exposed by the CMP. The configuration of each source/drain terminal 132 will also depend upon how the layer of gate conductor material 121 is actually patterned and, more particularly, whether or not sidewalls of each second source/drain section 132b of each source/drain terminal 132 are exposed during the patterning process.

For example, a CMP of the layer of gate conductor material 121 could be performed at process step 46 such that the top surfaces of the gate terminal 131 and the source/drain terminals 132 are co-planar and so that the top surfaces of the second source/drain sections 132b are exposed. Subsequently, the layer of the gate conductor material 121 could be patterned at process step 47 so that the sidewalls of the second source/drain sections 132b are exposed. See in the HEMT 2201, the MISHEMT 2202 and the MISHEMT 2203 in the semiconductor structures 2200A-2200C of FIGS. 22A-22C, respectively; see also the HEMT 2501, the MISHEMT 2502 and the MISHEMT 2503 in the semiconductor structures 2500A-2500C of FIGS. 25A-25C, respectively.

Alternatively, a CMP of the gate conductor material could be performed at process step 46 such that the top surfaces of the gate terminal and the source/drain terminals are co-planar and so that the top surfaces of each second source/drain section is exposed. Subsequently, the layer of the gate conductor material could be patterned at process step 47 so that the sidewalls of the second source/drain sections are not exposed. Thus, each source/drain terminal could further include an additional source/drain section, which is made of the gate conductor material and which is positioned laterally immediately adjacent to the sidewalls of the second source/drain section.

Alternatively, a CMP of the gate conductor material could be performed at process step 46 such that the top surfaces of the gate terminal and the source/drain terminals are co-planar but so that the top surfaces of the second source/drain sections are not exposed (e.g., if the layer of gate conductor material is thicker than the height of the second source/drain sections). Subsequently, the layer of the gate conductor material could be patterned at process step 47 so that the sidewalls of the second source/drain sections are exposed. Thus, each source/drain terminal could further include an additional source/drain section, which is made of the gate conductor material and which is immediately adjacent to the top surface of the second source/drain section.

Alternatively, a CMP of the gate conductor material could be performed at process step 46 such that the top surfaces of the gate terminal and the source/drain terminals are co-planar but so that the top surfaces of the second source/drain sections are not exposed. Subsequently, the layer of the gate conductor material could be patterned at process step 47 so that the sidewalls of the second source/drain sections are also not exposed. Thus, each source/drain terminal could further include an additional source/drain section, which is made of the gate conductor material and which is immediately adjacent to both the top surface and the sidewalls of the second source/drain section.

Alternatively, a CMP of the gate conductor material may be skipped at process step 46 such that the top surfaces of the source/drain terminals will be above the level of the top surface of the gate terminals and such that the top surfaces of the second source/drain sections are not exposed. Subsequently, the layer of the gate conductor material could be patterned at process step 47 so that the sidewalls of the second source/drain sections are exposed. Thus, each source/drain terminal could further include an additional source/drain section, which is made of the gate conductor material and which is immediately adjacent to the top surface of the second source/drain section.

Alternatively, a CMP of the gate conductor material may be skipped at process step 46 such that the top surfaces of the source/drain terminals will be above the level of the top surface of the gate terminal and such that the top surfaces of the second source/drain sections are not exposed. Subsequently, the layer of the gate conductor material can be patterned at process step 47 so that the sidewalls of the second source/drain sections are not exposed. Thus, each source/drain terminal could further include an additional source/drain section, which is made of the gate conductor material and which is immediately adjacent to both the top surface and sidewalls of the second source/drain section.

Since in the above-described method embodiments that follow process flow B, the dielectric layer 105 is concurrently patterned with the gate opening 111 for the first gate section 131a of the gate terminal 131 and with the source/drain openings 112 for the first source/drain sections 132a of the source/drain terminals 132, those lower/first gate and source/drain sections 131a and 132a within the dielectric layer 105 are considered self-aligned. Furthermore, since patterning of the layer of the gate conductor material 121 to form the second gate section 131b of the gate terminal 131 also concurrently impacts the final shape of the second source/drain sections 132b of the source/drain terminals 132, those upper-level sections of the gate and source/drain terminals (i.e., the second gate section 131b and the second source/drain sections 132b), which are all above the dielectric layer 105, are also considered self-aligned. With these multi-level self-aligned gate and source/drain terminals 131-132, fails related to terminal misalignment are avoided (e.g., as device sizes are reduced).

Also disclosed herein are embodiments of a semiconductor structure, which has been formed according to the above-described method embodiments. For example, see any of the semiconductor structures 900A-900C of FIGS. 9A-9C, 1000A-1000C of FIGS. 10A-10C, 1100A-1100C of FIGS. 11A-11C, 1200A-1200C of FIGS. 12A-12C, 1300A-1300C of FIGS. 13A-13C, 1400A-1400C of FIGS. 14A-14C, 2200A-2200C of FIGS. 22A-22C, and 2500A-2500C of FIGS. 25A-25C.

Specifically, the semiconductor structure can include a substrate 101 and, on the substrate 101, a stack of layers.

The stack of layers can include multiple epitaxial layers. The epitaxial layers can include: a buffer layer 102 on the substrate 101; a channel layer 103 and, more particularly, a III-V semiconductor channel layer on the buffer layer 102; and a barrier layer 104 on the channel layer 103. For illustration purposes, the drawings and the description above depict the epitaxial layers in the stack (e.g., the buffer layer 102, the channel layer 103 and the barrier layer 104) as being single layered structures (i.e., comprising one layer of buffer material, one layer of channel material and one layer of barrier material). However, it should be understood that, alternatively, any one or more of these epitaxial layers could be multi-layered structures (e.g., comprising multiple sub-layers of different buffer materials, multiple sub-layers of different III-V semiconductor channel materials and/or multiple sub-layers of different barrier materials). In some embodiments (e.g., see the semiconductor structures 900C of FIG. 9C, 1000C of FIG. 10C, 1100C of FIG. 11C, 1200C of FIG. 12C, 1300C of FIG. 13C, 1400C of FIG. 14C, 2200C of FIG. 22C, and 2500C of FIG. 25C), the stack of layers can further include a gate dielectric layer 106 on the top surface of the barrier layer 104. Finally, the stack of layers can include a blanket dielectric layer 105 on the top surface of the barrier layer 104 or, if applicable, on the top surface of the gate dielectric layer 106.

The semiconductor structure can further include a transistor. This transistor can be a high electron mobility transistor (HEMT) (e.g., see HEMTs 901, 1001, 1101, 1201, 1301, 1401, 2201, and 2501 in the "A" figures). Alternatively, the transistor can be a metal-insulator-semiconductor HEMT (MISHEMT) with a conformally deposited gate dielectric layer 108 (e.g., see the MISHEMTs 902, 1002, 1102, 1202, 1302, 1402, 2202, and 2502 in the "B" figures). Alternatively, the transistor could be a MISHEMT with a stack-embedded gate dielectric layer 106 (e.g., see the MISHEMTs 903, 1003, 1103, 1203, 1303, 1403, 2203 and 2503 in the "C" figures). Alternatively, the transistor could be any other similar type of transistor.

Each transistor can include, within the stack of layers discussed above, a gate opening 111 and source/drain openings 112. The gate opening 111 can be narrower than the source/drain openings 112, as illustrated. For example, the gate opening 111 can have a first width (w1) and the source/drain openings 112 can have a second width (w2) that is greater than the first width (w1). Alternatively, first width (w1) of the gate opening 111 could be equal to or greater than the second width (w2) of the source/drain openings.

The gate opening 111 can extend from the top surface of the dielectric layer 105 to the bottom surface of the dielectric layer 105. In some embodiments (e.g., see the semiconductor structures 900A-900B of FIGS. 9A-9B, 1000A-1000B of FIGS. 10A-10B, 1100A-1100B of FIGS. 11A-11B, 1200A-1200B of FIGS. 12A-12B, 1300A-1300B of FIGS. 13A-13B, 1400A-1400B of FIGS. 14A-14B, 2200A-2200B of FIGS. 22A-22B and 2500A-2500B of FIGS. 25A-25B), the bottom of the gate opening 111 can be at the top surface of the barrier layer 104. In other embodiments (e.g., see the semiconductor structures 900C of FIG. 9C, 1000C of FIG. 10C, 1100C of FIG. 11C, 1200C of FIG. 12C, 1300C of FIG. 13C, 1400C of FIG. 14C, 2200C of FIG. 22C and 2500C of FIG. 25C), the bottom of the gate opening 111 can be at the top surface of the stack-embedded gate dielectric layer 106.

The source/drain openings 112 can each extend from the top surface of the dielectric layer 105 to the channel layer 103. Thus, in some embodiments (e.g., see the semiconductor structures 900A-900B of FIGS. 9A-9B, 1000A-1000B of FIGS. 10A-10B, 1100A-1100B of FIGS. 11A-11B, 1200A-1200B of FIGS. 12A-12B, 1300A-1300B of FIGS. 13A-13B, 1400A-1400B of FIGS. 14A-14B, 2200A-2200B of FIGS. 22A-22B and 2500A-2500B of FIGS. 25A-25B), each source/drain opening 112 extends completely through the dielectric layer 105 and the barrier layer 104 to the channel layer 103. In other embodiments (e.g., see the semiconductor structures 900C of FIG. 9C, 1000C of FIG. 10C, 1100C of FIG. 11C, 1200C of FIG. 12C, 1300C of FIG. 13C, 1400C of FIG. 14C, 2200C of FIG. 22C and 2500C of FIG. 25C), each source/drain opening 112 extends completely through the dielectric layer 105, the stack-embedded gate dielectric layer 106, and the barrier layer 104 to the channel layer 103.

Figure 14A:
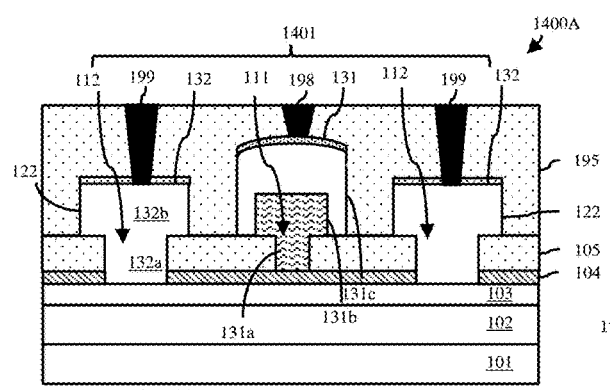
FIGS. 14A-14C are cross-section diagrams illustrating alternative embodiments of a HEMT, a MISHEMT and another MISHEMT, respectively, formed according to process flow A.
Figure 14B:
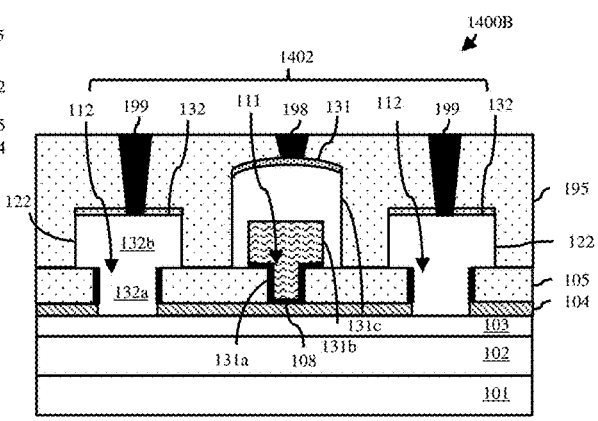
Figure 14C:
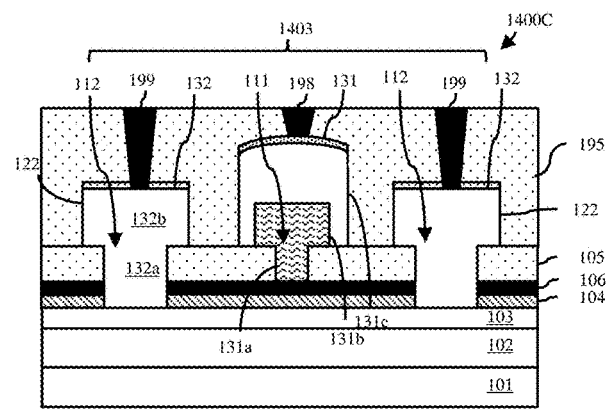

In some embodiments, each source/drain opening 112 can have an essentially uniform width (as illustrated) or a slightly tapered width toward the channel layer 103 (e.g., see the semiconductor structures 900A-900C of FIGS. 9A-9C, 1000A-1000C of FIGS. 10A-10C, 1100A-1100C of FIGS. 11A-11C, 1200A-1200C of FIGS. 12A-12C, 1300A-1300C of FIGS. 13A-13C and 1400A-1400C of FIGS. 14A-14C. In other embodiments, each source/drain opening 112 can have a lower narrow portion, which is within the barrier layer 104 and, if present, the stack-embedded gate dielectric layer 106, and an upper wider portion, which is above the lower narrow portion within the dielectric layer 105 (e.g., see semiconductor structures 2200A-2200C of FIGS. 22A-22C and 2500A-2500C of FIGS. 25A-25C). Optionally, in embodiments where each source/drain opening 112 has a lower narrow portion and an upper wider portion, sidewall spacers 114 can be within the upper wider portion above the barrier layer 104 (or, if applicable, above the gate dielectric layer 106) and further positioned laterally adjacent to the sidewalls of the opening (e.g., see semiconductor structures 2500A-2500C of FIGS. 25A-25C).

Each transistor can further include a gate terminal 131. The gate terminal 131 can include a first gate section 131a and a second gate section 131b. The first gate section 131a can be within a gate opening 111, which extends through the dielectric layer 105 and which has a bottom above the barrier layer 104 in the stack. The second gate section 131b can be above the gate opening 111 and, more particularly, above and immediately adjacent to the first gate section 131a so as to be above the level of the top surface of the dielectric layer 105. The first gate section 131a and the second gate section 131b of the gate terminal 131 can be made of a patterned layer of gate conductor material 121. Optionally, the second gate section 131b can be wider than the first gate section 131a such that it extends laterally onto the top surface of the dielectric layer 105. Thus, the gate terminal 131 could be T-shaped, inverted L-shaped, etc. For illustration purposes, the drawings and the description depict the first and second gate sections 131a-131b (in combination) as being a single layered structure (i.e., comprising one layer of gate conductor material). However, it should be understood that, alternatively, the first and second gate sections 131a-131b (in combination) could be multi-layered structure (i.e., comprising multiple sub-layers of different conductor materials).

It should be noted that, if the transistor is a HEMT (see the "A" figures), that the gate terminal 131 can be a Schottky contact gate terminal and the bottom of the first gate section 131a can be immediately adjacent to the barrier layer 104. As discussed in greater detail above with regard to the method embodiments, the gate conductor material 121 used for the gate terminal 131 of the HEMT must include metal(s) or metal alloy(s) that will form such a Schottky contact (i.e., a potential energy barrier for electrons) at the metal-semiconductor junction at the bottom of the gate opening 111. Alternatively, if the transistor is a MISHEMT (see the "B" figures), a conformal gate dielectric layer 108 can line the gate opening 111 and the sides and the bottom of the first gate section 131a can be immediately adjacent to the gate dielectric layer 108. Alternatively, if the transistor is a different MISHEMT (see the "C" figures) where a gate dielectric layer 106 is embedded in the stack, then the bottom of the first gate section 131a can be immediately adjacent to the gate dielectric layer 106. As discussed in greater detail above with regard to the method embodiments, since such MISHEMTs do not require a Schottky contact gate terminal, the gate conductor material 121 used for the gate terminal of the MISHEMTs could include one layer or multiple sub-layers of any suitable gate conductor material (e.g., gate metal(s), gate metal alloy(s), doped polysilicon, etc.).

Each transistor can further include a source/drain terminal 132. Each source/drain terminal 132 can include a first source/drain section 132a and a second source/drain section 132b. The first source/drain section 132a can be within a source/drain opening 112, which extends through the dielectric layer 105 and the barrier layer 104 to the channel layer 130. The second source/drain section 132b can be above the source/drain opening 112 and, more particularly, above and immediately adjacent to the first source/drain section 132a so to be above the level of the top surface of the dielectric layer 105. In each source/drain terminal 132, the first source/drain section 132a and the second source/drain section 132b can be made of a patterned source/drain conductor material 122. Optionally, the second source/drain section 132b can be wider than the first source/drain section 132a such that it extends laterally onto the top surface of the dielectric layer. Thus, each source/drain terminal 132 could be T-shaped, inverted L-shaped, etc. For illustration purposes, the drawings and the description depict the first and second source/drain sections (in combination) of each source/drain terminal as being a single layered structure (i.e., comprising one layer of conductor material). However, it should be understood that, alternatively, the first and second source/drain sections (in combination) of each source/drain terminal could be multi-layered structure (i.e., comprising multiple sub-layers of different conductor materials). As discussed in greater detail above with regard to the method embodiments, the source/drain conductor material 122 should be suitable for the formation of ohmic contact source/drain terminals at the metal-semiconductor junction at the bottom of the source/drain openings 112.

Additionally, it should be noted that, due some alternative and/or optional process steps within the above-described method embodiments, certain features of the semiconductor structure embodiments, particularly, related to the structure of the gate terminal 131 and the structure of the source/drain terminals 132 can vary.

For example, in semiconductor structure embodiments formed according to process flow A discussed above (e.g., see the semiconductor structures 900A-900C of FIGS. 9A-9C, 1000A-100C of 10A-10C, 1100A-1100C of FIGS. 11A-11C, 1200A-1200C of FIGS. 12A-12C, 1300A-1300C of FIGS. 13A-13C, and 1400A-1400C of FIGS. 14A-14C), the source/drain terminals 132 can be completely devoid of the gate conductor material 121, but the gate terminal 131 may or may not be devoid of the source/drain conductor material 122. Specifically, in some of these embodiments formed according to process flow A (e.g., see the semiconductor structures 900A-900C of FIGS. 9A-9C, 1000A-100C of 10A-10C, 1100A-1100C of FIGS. 11A-11C, and 1200A-1200C of FIGS. 12A-12C), the top surfaces of the gate terminal 131 and the source/drain terminals 132 are essentially co-planar. In the semiconductor structure 900A-900C of FIGS. 9A-9C, the gate terminal 131 is also completely devoid of source/drain conductor material 122. However, in the semiconductor structure 1000A-1000C of FIGS. 10A-10C, the gate terminal 131 has additional gate section 131c, which is made of the source/drain conductor material 122 and which is positioned laterally immediately adjacent to the sidewalls of the second gate section 131b. In the semiconductor structure 1100A-1100C of FIGS. 11A-11C, the gate terminal 131 has an additional gate section 131c, which is made of the source/drain conductor material 122 and which is immediately adjacent to the top surface of the second gate section 131b. In the semiconductor structure 1200A-1200C of FIGS. 12A-12C, the gate terminal 131 has an additional gate section 131c, which is made of the source/drain conductor material 122 and which is immediately adjacent to the top surface and the sidewalls of the second gate section 131b.

In other embodiments formed according to process flow A discussed above, the top surfaces of the gate terminal 131 and the source/drain terminals 132 are not co-planar (e.g., see the semiconductor structures 1300A-1300C of FIGS. 13A-13C and 1400A-1400C of FIGS. 14A-14C). Specifically, the top of the gate terminal 131 is a first distance above the level of the top surface of the dielectric layer 105 and the tops of the source/drain terminals are a second distance, which is less than the first distance, above the level of the top surface of the dielectric layer 105. In the semiconductor structure 1300A-1300C of FIGS. 13A-13C, the gate terminal 131 has an additional gate section 131c, which is made of the source/drain conductor material 122, which is relatively thick, and which is positioned immediately adjacent to the top surface of the second gate section 131b. In the semiconductor structure 1400A-1400C of FIGS. 14A-14C, the gate terminal 131 can have an additional gate section 131c, which is made of the source/drain conductor material 122 and which is immediately adjacent to both the top surface and the sidewalls of the second gate section 131b.

In semiconductor structure embodiments formed according to process flow B discussed above (e.g., see the semiconductor structures 2200A-2200C of FIGS. 22A-22C and 2500A-2500C of FIGS. 25A-25C), the gate terminal 131 can be completely devoid of the gate conductor material 121, but the source/drain terminals may be devoid of the gate conductor material 121 (as shown) or, alternatively, may not be devoid of the gate conductor material 121 (not shown).

In any case, each of the disclosed semiconductor structure embodiments can further include one or more additional dielectric layers 195 (e.g., an optional conformal etch stop layer, an interlayer dielectric layer, etc.) over the dielectric layer 105 and the second gate section 131b and the second source/drain sections 132b thereon. Each of the disclosed semiconductor structure embodiments can further include middle of the line (MOL) contacts that extend through the additional dielectric layer(s) 195 to the transistor (e.g., see MOL contact 198 to the gate terminal 131 and MOL contacts 199 to the source/drain terminals 132).

Additionally, it should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a stack of layers comprising: a channel layer; a barrier layer on the channel layer; and a dielectric layer on the barrier layer;
   source/drain terminals; and
   a gate terminal positioned laterally between the source/drain terminals,
   wherein each source/drain terminal comprises: a first source/drain section within a source/drain opening that extends through the dielectric layer and the barrier layer to the channel layer; and a second source/drain section above the first source/drain section,
   wherein each source/drain opening has a lower portion within the barrier layer and an upper portion within the dielectric layer and wider than the lower portion,
   wherein the gate terminal comprises: a first gate section within a gate opening that extends through the dielectric layer and has a bottom above the barrier layer; and a second gate section above the first gate section and the dielectric layer, and
   wherein the first source/drain section and the second source/drain section comprise a source/drain conductor material and the first gate section and the second gate section comprise a gate conductor material that is different from the source/drain conductor material,
   wherein the stack of layers further includes a gate dielectric layer between the barrier layer and the dielectric layer,
   wherein each source/drain opening further has a center portion within the gate dielectric layer between the lower portion and the upper portion, and
   wherein the center portion and the lower portion have approximately equal widths.

2. The structure of claim 1, wherein the first source/drain section has a first width in the lower portion of the source/drain opening and a second width that is wider than the first width in the upper portion of the source/drain opening.

3. The structure of claim 1, further comprising sidewall spacers within the source/drain opening above the barrier layer and positioned laterally adjacent to essentially vertical surfaces of the dielectric layer, wherein the first source/drain section has an essentially uniform width within the lower portion and the upper portion of the source/drain opening.

4. The structure of claim 1, wherein the first source/drain section has a first width within the lower portion and the center portion of the source/drain opening and a second width that is wider than the first width in the upper portion of the source/drain opening.

5. The structure of claim 1, further comprising sidewall spacers within the source/drain opening above the gate dielectric layer and positioned laterally adjacent to essentially vertical surfaces of the dielectric layer, wherein the first source/drain section has an essentially uniform width in the lower portion, the center portion, and the upper portion of the source/drain opening.

6. The structure of claim 1, wherein the second source/drain section is wider than the first source/drain section and extends laterally onto the dielectric layer.

7. The structure of claim 1,
wherein the gate opening extends through the dielectric layer to the gate dielectric layer, and
wherein the first gate section is immediately adjacent to the gate dielectric layer at a bottom of the gate opening.

8. A structure comprising:
a stack of layers comprising: a channel layer; a barrier layer on the channel layer; and a dielectric layer on the barrier layer;
source/drain terminals;
a gate terminal positioned laterally between the source/drain terminals,
wherein each source/drain terminal comprises: a first source/drain section within a source/drain opening; and a second source/drain section above the first source/drain section,
wherein the source/drain opening extends through the dielectric layer and the barrier layer to the channel layer and includes:
a lower portion within the barrier layer; and
an upper portion within the dielectric layer and wider than the lower portion,
wherein sidewalls of the upper portion are offset from sidewalls of the lower portion,
wherein the gate terminal comprises: a first gate section within a gate opening that extends through the dielectric layer and has a bottom above the barrier layer; and a second gate section above the first gate section and the dielectric layer, and
wherein the first source/drain section and the second source/drain section comprise a source/drain conductor material and the first gate section and the second gate section comprise a gate conductor material that is different from the source/drain conductor material; and
sidewall spacers within the source/drain opening above the barrier layer and positioned laterally adjacent to essentially vertical surfaces of the dielectric layer, wherein the first source/drain section has an essentially uniform width within the lower portion and the upper portion of the source/drain opening.

9. The structure of claim 8, wherein the first source/drain section has a first width in the lower portion of the source/drain opening and a second width that is wider than the first width in the upper portion of the source/drain opening.

10. The structure of claim 8, wherein the second source/drain section is wider than the first source/drain section and extends laterally onto the dielectric layer.

11. The structure of claim 8, wherein the first gate section is any of the following:
immediately adjacent to the barrier layer at a bottom of the gate opening; and
immediately adjacent to a gate dielectric material lining the gate opening.

12. A structure comprising:
a stack of layers comprising: a channel layer; a barrier layer on the channel layer; a gate dielectric layer on the barrier layer; and a dielectric layer on the gate dielectric layer;
source/drain terminals; and
a gate terminal positioned laterally between the source/drain terminals,
wherein each source/drain terminal comprises: a first source/drain section within a source/drain opening; and a second source/drain section above the first source/drain section,
wherein the source/drain opening extends through the dielectric layer, the gate dielectric layer, and the barrier layer to the channel layer and includes:
a lower portion within the barrier layer;
a center portion within the gate dielectric layer; and
an upper portion within the dielectric layer and wider than the lower portion and the center portion,
wherein sidewalls of the upper portion are offset from vertically aligned sidewalls of the lower portion and the center portion,
wherein the gate terminal comprises: a first gate section within a gate opening that extends through the dielectric layer and has a bottom above the barrier layer; and a second gate section above the first gate section and the dielectric layer, and
wherein the first source/drain section and the second source/drain section comprise a source/drain conductor material and the first gate section and the second gate section comprise a gate conductor material that is different from the source/drain conductor material.

13. The structure of claim 12, wherein the first source/drain section has a first width in the lower portion and the center portion of the source/drain opening and a second width that is wider than the first width in the upper portion of the source/drain opening.

14. The structure of claim 12, further comprising sidewall spacers within the source/drain opening above the gate dielectric layer and positioned laterally adjacent to essentially vertical surfaces of the dielectric layer, wherein the first source/drain section has an essentially uniform width in the lower portion, the center portion, and the upper portion of the source/drain opening.

15. The structure of claim 12, wherein the second source/drain section is wider than the first source/drain section and extends laterally onto the dielectric layer.

* * * * *